United States Patent
Imada et al.

(10) Patent No.: US 11,936,307 B2
(45) Date of Patent: Mar. 19, 2024

(54) POWER CONTROL SYSTEM AND CONTROLLER FOR POWER CONTROL SYSTEM

(71) Applicant: Mitsubishi Electric Corporation, Tokyo (JP)

(72) Inventors: Noriyuki Imada, Tokyo (JP); Masahiro Hario, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 422 days.

(21) Appl. No.: 17/283,297

(22) PCT Filed: Nov. 28, 2018

(86) PCT No.: PCT/JP2018/043822
§ 371 (c)(1),
(2) Date: Apr. 7, 2021

(87) PCT Pub. No.: WO2020/110236
PCT Pub. Date: Jun. 4, 2020

(65) Prior Publication Data
US 2021/0391808 A1 Dec. 16, 2021

(51) Int. Cl.
*H02M 7/797* (2006.01)
*H02M 1/00* (2006.01)
(Continued)

(52) U.S. Cl.
CPC ......... *H02M 7/797* (2013.01); *H02M 1/0009* (2021.05); *H02M 1/08* (2013.01);
(Continued)

(58) Field of Classification Search
CPC ...... H02M 7/797; H02M 1/0009; H02M 1/08; H02M 1/32; H02M 7/4835; H03K 19/20;
(Continued)

(56) References Cited

U.S. PATENT DOCUMENTS

2007/0213879 A1* 9/2007 Iwamura ................ H04B 3/56
700/292
2015/0236611 A1* 8/2015 Nakazawa .......... H02M 7/4835
363/123
(Continued)

FOREIGN PATENT DOCUMENTS

JP 2001025171 A * 1/2001 ............... H02J 3/36
JP 2015070746 A * 4/2015 ............... H02J 3/32
(Continued)

OTHER PUBLICATIONS

See attached translated version of JP2015070746A. (Year: 2015).*
(Continued)

*Primary Examiner* — Emily P Pham
(74) *Attorney, Agent, or Firm* — BUCHANAN INGERSOLL & ROONEY PC

(57) ABSTRACT

A power converter includes first and second arms, each having switching elements, and performs power conversion between a DC system and an AC system. An AC circuit breaker and a current control circuit are connected in series between the AC system and the power converter. The current control circuit includes a current-limiting resistor and a disconnector connected in parallel. A controller instructs a disconnector to close after an initial charge of the power converter and opens the AC circuit breaker when an impedance of a line between a first node located on a first end side of the current control circuit and a second node located on a second end side of the current control circuit is not less than a first threshold and an accumulated value of a current flowing through the current control circuit within a certain period of time is not less than a second threshold.

13 Claims, 16 Drawing Sheets

(51) Int. Cl.
  *H02M 1/08*    (2006.01)
  *H02M 1/32*    (2007.01)
  *H03K 19/20*   (2006.01)
  *H02J 3/36*    (2006.01)
(52) U.S. Cl.
  CPC .............. *H02M 1/32* (2013.01); *H03K 19/20* (2013.01); *H02J 3/36* (2013.01)
(58) Field of Classification Search
  CPC .. H02J 3/36; Y02E 60/60; H02H 3/28; H02H 3/40; H02H 7/008; H02H 9/001
  See application file for complete search history.

(56) References Cited

U.S. PATENT DOCUMENTS

2016/0294282 A1* 10/2016 Herfurth .............. H05B 45/375
2021/0201792 A1*  7/2021 Lee ..................... G09G 3/3275

FOREIGN PATENT DOCUMENTS

| JP | 2018007295 A |   | 1/2018 |              |
|----|--------------|---|--------|--------------|
| JP | 2018046642 A | * | 3/2018 | ... H02H 3/087 |

OTHER PUBLICATIONS

See attached translated version of JP2001025171A. (Year: 2001).*
See attached translated version of JP2018046642A. (Year: 2018).*
International Search Report (PCT/ISA/210) with translation and Written Opinion (PCT/ISA/237) dated Feb. 5, 2019, by the Japan Patent Office as the International Searching Authority for International Application No. PCT/JP2018/043822.

* cited by examiner

POWER CONTROL SYSTEM AND CONTROLLER FOR POWER CONTROL SYSTEM

TECHNICAL FIELD

The present invention relates to a power control system and a controller for a power control system.

BACKGROUND ART

In initial charge of a capacitor in a power converter of MMC (Modular Multilevel Converter) type, a sudden flow of a current to the capacitor needs to be restrained. For example, the system of PTL 1 (Japanese Patent Laying-Open No. 2018-7295) includes a current-limiting resistor for charging and a disconnector connected in parallel with the current-limiting resistor in order to allow a smaller current to flow through a capacitor in initial charge of a power converter than in operation of the power converter.

In initial charge of the power converter, the disconnector is opened, allowing a current to flow from an AC (alternating-current) system through the current-limiting resistor to the power converter. In operation of the power converter, the disconnector is closed, allowing a current to flow from the AC system through the disconnector to the power converter.

CITATION LIST

Patent Literature

PTL 1: Japanese Patent Laying-Open No. 2018-7295

SUMMARY OF INVENTION

Technical Problem

In operation of the power converter, however, the disconnector may not close completely due to a contact fault of the disconnector even though the disconnector is set to close, and a current may flow through the current-limiting resistor. If an accumulated value of a current flowing through the current-limiting resistor within a certain period of time increases, the current-limiting resistor may be damaged by a fire.

An object of the present invention is therefore to provide a power control system capable of preventing an excessively large current from flowing through a current-limiting resistor.

Solution to Problem

A power control system of the present invention includes a power converter of self-excited type that includes a first arm and a second arm, each including one or more switching elements, and performs power conversion between a DC (direct-current) system and an AC system, and an AC circuit breaker and a current control circuit connected in series on a path between the AC system and the power converter. The current control circuit includes a current-limiting resistor and a disconnector connected in parallel. The power control system further includes a controller that instructs the disconnector to close after an initial charge of the power converter and opens the AC circuit breaker when an impedance of a line between a first node located on a first end side of the current control circuit and a second node located on a second end side of the current control circuit is not less than a first threshold and an accumulated value of a current flowing through the current control circuit within a certain period of time is not less than a second threshold.

Advantageous Effects of Invention

The present invention can prevent an excessively large current from flowing through the current-limiting resistor.

DESCRIPTION OF EMBODIMENTS

Figure 1:
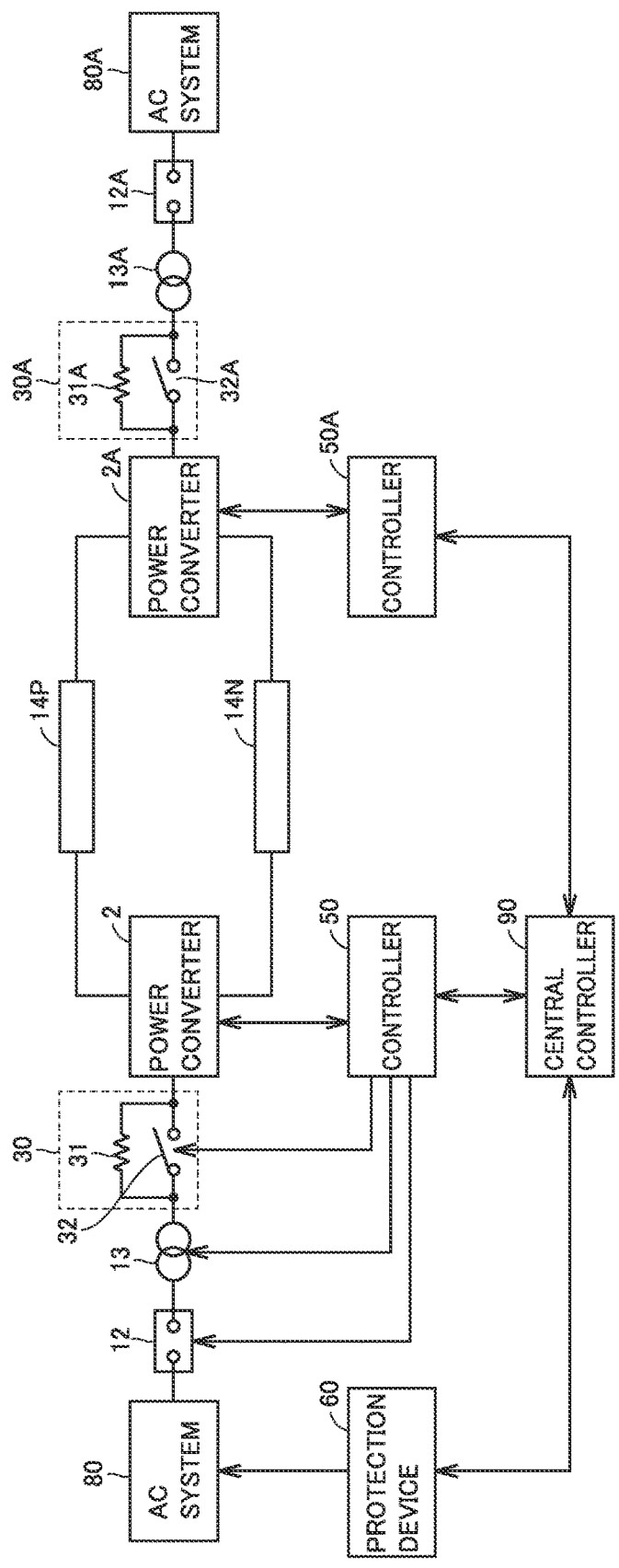
FIG. 1 shows a schematic configuration example of a power control system.

Embodiments of the present invention will be described below with reference to the drawings. In the following description, the same parts and components are denoted by the same reference characters. Their names and functions are also the same. Therefore, detailed description thereof will not be repeated.

Embodiment 1

<Configuration Example of Power Control System>

FIG. 1 shows a schematic configuration example of a power control system. The power control system is a system for controlling power of a DC power transmission system of monopolar configuration. Electric power is transmitted and received between two AC systems 80, 80A via a DC power transmission line 14P on the positive electrode side and a DC power transmission line 14N on the negative electrode side, which are DC systems.

AC system 80 is connected to a power converter 2 via an AC circuit breaker 12, a transformer 13, and a current control circuit 30. AC circuit breaker 12, transformer 13, and current control circuit 30 are connected in series on a path between AC system 80 and power converter 2. AC system 80A is connected to a power converter 2A via an AC circuit breaker 12A, a transformer 13A, and a current control circuit 30A. AC circuit breaker 12A, transformer 13A, and current control circuit 30A are connected in series on a path between AC system 80A and power converter 2A. Power converters 2, 2A are connected to DC power transmission lines 14P, 14N (hereinbelow, collectively referred to as "DC power transmission line 14" or "DC system 14" as well).

Electric power is transmitted from AC system 80 to AC system 80A. Specifically, power converter 2 operates as a forward converter, and power converter 2A functions as a reverse converter. Power converter 2 converts AC power into DC power. The resultant DC power is subjected to DC power transmission via DC power transmission lines 14P, 14N. DC power is converted into AC power by power converter 2A at a receiving end, and the AC power is supplied to AC system 80A via transformer 13A. A reverse conversion operation is performed when power converter 2 operates as the reverse converter and power converter 2A functions as the forward converter.

Controller 50 controls an operation of power converter 2. Controller 50A controls an operation of power converter 2A. A protection device 60 performs various processes for protecting AC system 80. A central controller 90 corresponds to a higher-level device for each of controllers 50, 50A and protection device 60. Central controller 90 is configured so as to communicate with each of controllers 50, 50A and protection device 60, relays information between the devices or provides an instruction to each device.

Current control circuit 30 controls a current flowing between AC system 80 and power converter 2. Current control circuit 30 includes a current-limiting resistor 31 and a disconnector 32 connected in parallel with current-limiting resistor 31. Disconnector 32 is controlled by controller 50 to close and open. The disconnector may be a circuit breaker.

Transformer 13 is a tapped transformer that switches between a plurality of taps provided to a primary winding and adjusts a voltage by controlling a transformer ratio. A tap position is controlled by controller 50.

When AC circuit breaker 12 is opened, an AC current flowing between AC system 80 and power converter 2 is interrupted. When AC circuit breaker 12 is closed, an AC current flows between AC system 80 and power converter 2.

For example, controller 50 controls an operation of power converter 2, controls disconnector 32 to open and close, controls the tap position of transformer 13, and controls AC circuit breaker 12 to open and close.

Power converter 2A, AC circuit breaker 12A, transformer 13A, current control circuit 30A, and controller 50A are similar in configuration to power converter 2, AC circuit breaker 12, transformer 13, current control circuit 30, and controller 50, respectively.

(Configuration of Power Converter)

Figure 2:
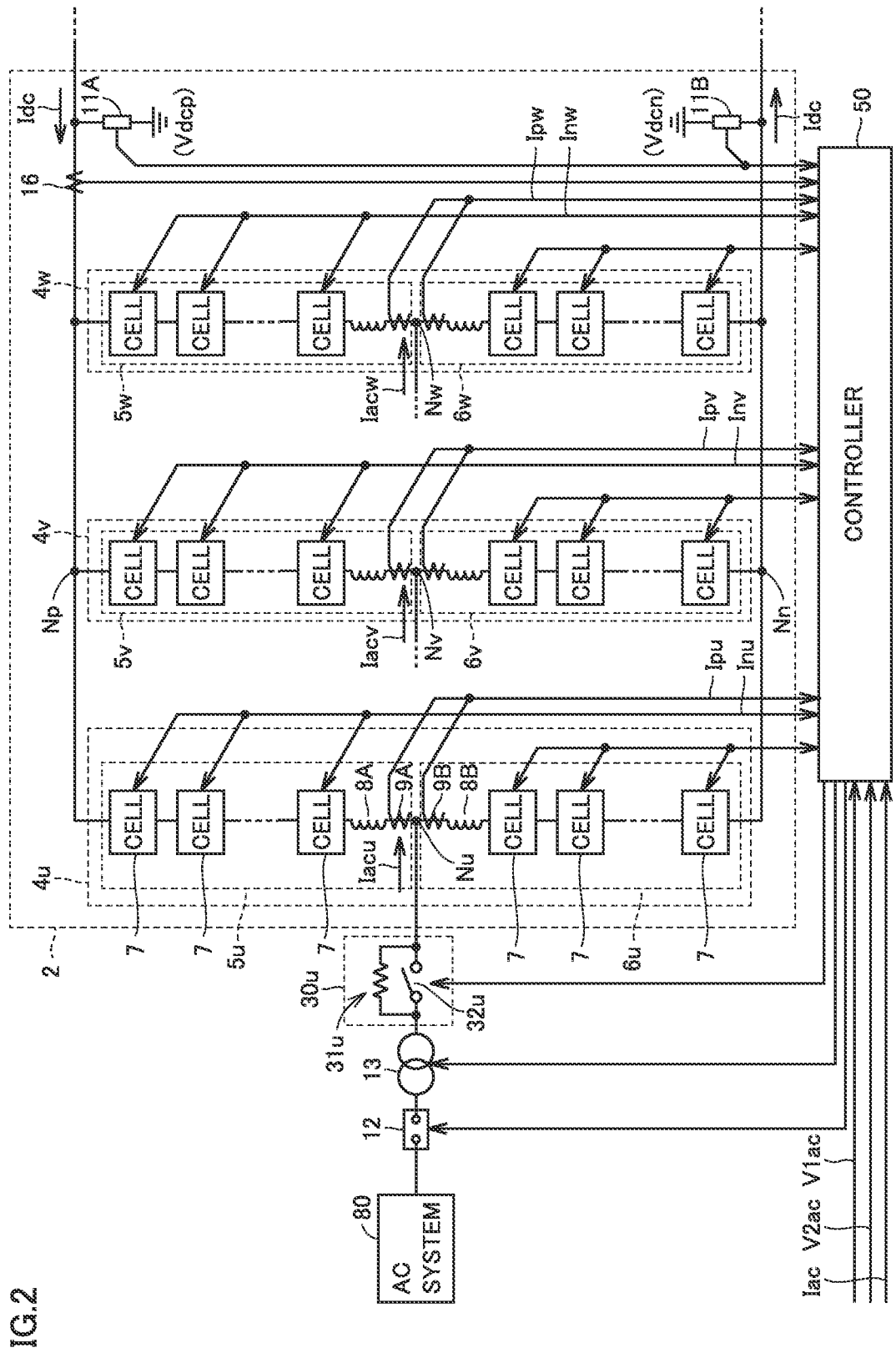
FIG. 2 is a schematic configuration diagram of a power converter.

FIG. 2 is a schematic configuration diagram of a power converter. Referring to FIG. 2, power converter 2 is formed of a self-excited voltage power converter. Specifically, power converter 2 is formed of a modular multilevel converter including a plurality of series-connected submodules 7. "Submodule" is also referred to as "converter cell". Power converter 2 performs power conversion between the DC system (specifically, DC power transmission lines 14P, 14N) and AC system 80.

Power converter 2 includes a plurality of leg circuits $4u$, $4v$, $4w$ (when mentioned non-specifically, referred to as leg circuit 4) connected in parallel between a positive DC terminal (i.e., high-potential-side DC terminal) Np and a negative DC terminal (i.e., low-potential-side DC terminal) Nn.

Leg circuit 4 is provided for each of AC phases. Leg circuit 4 is connected between AC system 80 and DC power transmission lines 14P, 14N and performs power conversion. FIG. 2 shows a case where AC system 80 is a three-phase AC system, and three leg circuits $4u$, $4v$, $4w$ are provided corresponding to U-phase, V-phase, and W-phase, respectively.

AC terminals Nu, Nv, Nw respectively provided in leg circuits $4u$, $4v$, $4w$ are connected to AC system 80 via current control circuit 30, transformer 13, and AC circuit breaker 12. For ease of illustration, FIG. 2 does not show the connections between AC terminals Nv, Nw and current control circuit 30.

High-potential-side DC terminal Np and low-potential-side DC terminal Nn connected in common to leg circuits 4 are connected to DC power transmission lines 14P, 14N, respectively.

In place of AC terminals Nu, Nv, Nw, a primary winding may be provided in each of leg circuits $4u$, $4v$, $4w$, so that leg circuits $4u$, $4v$, $4w$ are connected to transformer 13 in an AC manner via secondary windings magnetically coupled with the primary windings. In this case, the primary windings may be reactors 8A, 8B described below. Specifically, leg circuit 4 is electrically (i.e., in a DC manner or an AC manner) to AC system 80 via a connector provided for each of leg circuits $4u$, $4v$, $4w$, such as AC terminals Nu, Nv, Nw or the primary winding described above.

Leg circuit $4u$ includes an upper arm $5u$, extending from high-potential-side DC terminal Np to AC terminal Nu, and a lower arm $6u$, extending from low-potential-side DC terminal Nn to AC terminal Nu. AC terminal Nu which is a connection point between upper arm $5u$ and lower arm $6u$ is connected to transformer 13 via current control circuit 30. Leg circuit $4v$ includes an upper arm $5v$, extending from high-potential-side DC terminal Np to AC terminal Nu, and a lower arm $6v$, extending from low-potential-side DC terminal Nn to AC terminal Nu. AC terminal Nv which is a connection point between upper arm $5v$ and lower arm $6v$ is connected to transformer 13 via current control circuit 30. Leg circuit $4w$ includes an upper arm $5w$, extending from high-potential-side DC terminal Np to AC terminal Nu, and a lower arm $6w$, extending from low-potential-side DC terminal Nn to AC terminal Nu. AC terminal Nw which is a connection point between upper arm 5w and lower arm 6w is connected to transformer 13 via current control circuit 30.

High-potential-side DC terminal Np and low-potential-side DC terminal Nn are connected to DC power transmission lines 14P and 14N, respectively. Leg circuits 4v, 4w are similar to leg circuit 4u in configuration, and accordingly, leg circuit 4u will be described below representatively.

Upper arm 5u includes cascade-connected, positive-side submodules 7 and positive-side reactor 8A. Positive-side submodules 7 and positive-side reactor 8A are connected in series.

Similarly, lower arm 6u includes cascade-connected, negative-side submodules 7 and negative-side reactor 8B. Negative-side submodules 7 and negative-side reactor 8B are connected in series.

Reactor 8A may be inserted at any position of upper arm 5u of leg circuit 4u, and reactor 8B may be inserted at any position of lower arm 6u of leg circuit 4u. A plurality of reactors 8A and a plurality of reactors 8B may be provided. The reactors may have different inductance values. Further, only reactor 8A of upper arm 5u or only reactor 8B of lower arm 6u may be provided.

Reactors 8A, 8B are provided to prevent a sudden increase of a fault current in the event of a fault in, for example, AC system 80 or DC power transmission line 14.

Controller 50 obtains an amount of electricity (e.g., current, voltage) for control from a plurality of detectors. Specifically, the detectors include DC voltage detectors 11A, 11B, DC current detector 16, and arm current detectors 9A, 9B provided in each leg circuit 4.

A signal detected by each detector is input to controller 50. Controller 50 outputs an operation command for controlling the state of operation of each submodule based on a detected signal.

Although FIG. 2 collectively shows some of signal lines for signals input from the respective detectors to controller 50 and signal lines for signals input and output between controller 50 and the respective submodules 7 for ease of illustration, in actuality, they are provided for the respective detectors and for respective submodules 7. Signal lines between each submodule 7 and controller 50 may be provided individually for transmission and reception. For example, these signals are transmitted via optical fibers in terms of noise tolerance.

Each detector will now be described specifically.

DC voltage detector 11A detects a DC voltage Vdcp of high-potential-side DC terminal Np connected to DC power transmission line 14P. DC voltage detector 11B detects a DC voltage Vdcn of low-potential-side DC terminal Nn connected to DC power transmission line 14N.

DC current detector 16 detects a DC current Idc flowing through high-potential-side DC terminal Np.

Arm current detectors 9A and 9B provided in leg circuit 4u for U-phase detect an upper arm current Ipu flowing through upper arm 5u and a lower arm current Inu flowing through lower arm 6u, respectively. Similarly, arm current detectors 9A and 9B provided in leg circuit 4v for V-phase detect an upper arm current Ipv and a lower arm current Inv, respectively. Arm current detectors 9A and 9B provided in leg circuit 4w for W-phase detect an upper arm current Ipw and a lower arm current Inw, respectively.

(Configuration Example of Submodule)

Figure 3:
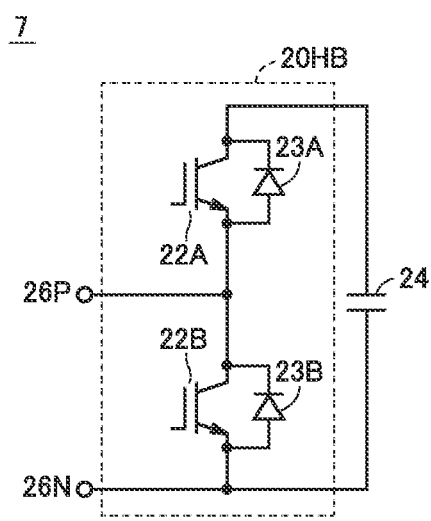
FIG. 3 is a circuit diagram of an example of one of submodules constituting each leg circuit of FIG. 2.

FIG. 3 is a circuit diagram showing an example of one of the submodules constituting each leg circuit of FIG. 2. Submodule 7 shown in FIG. 3 includes a half-bridge conversion circuit 20HB and a DC capacitor 24, which serves as an energy storage.

Half-bridge conversion circuit 20HB includes series-connected switching elements 22A, 22B and series-connected diodes 23A, 23B. Diodes 23A, 23B are connected in anti-parallel (i.e., in parallel in the reverse bias direction) with switching elements 22A, 22B, respectively. DC capacitor 24 is connected in parallel with a series connected circuit of switching elements 22A, 22B and holds a DC voltage. A connection node between switching elements 22A, 22B is connected to a high-potential-side input-output terminal 26P. A connection node between switching element 22B and DC capacitor 24 is connected to a low-potential-side input-output terminal 26N.

In normal operation, one of switching elements 22A, 22B is turned on, and the other switching element is turned off. When switching element 22A is turned on and switching element 22B is turned off, a voltage across DC capacitor 24 is applied between input-output terminals 26P, 26N. Contrastingly, when switching element 22A is turned off and switching element 22B is turned on, the voltage between input-output terminals 26P, 26N is 0 V.

Submodule 7 shown in FIG. 3 can thus alternately turn on switching elements 22A, 22B, to thereby output a zero voltage or a positive voltage dependent on the voltage of DC capacitor 24. Diodes 23A, 23B are provided for protection upon application of reverse voltage to switching elements 22A, 22B.

A self-arc-extinguishing switching element that can control both the on operation and the off operation is used as each of switching elements 22A, 22B. Switching elements 22A, 22B are, for example, IGBTs (Insulated Gate Bipolar Transistors) or GCTs (Gate Commutated Turn-Off Thyristors).

The configuration of submodule 7 described above is merely an example, and submodule 7 of another configuration may be used in the present embodiment. For example, submodule 7 may be formed of a full-bridge conversion circuit or a three-quarter-bridge conversion circuit.

Figure 4:
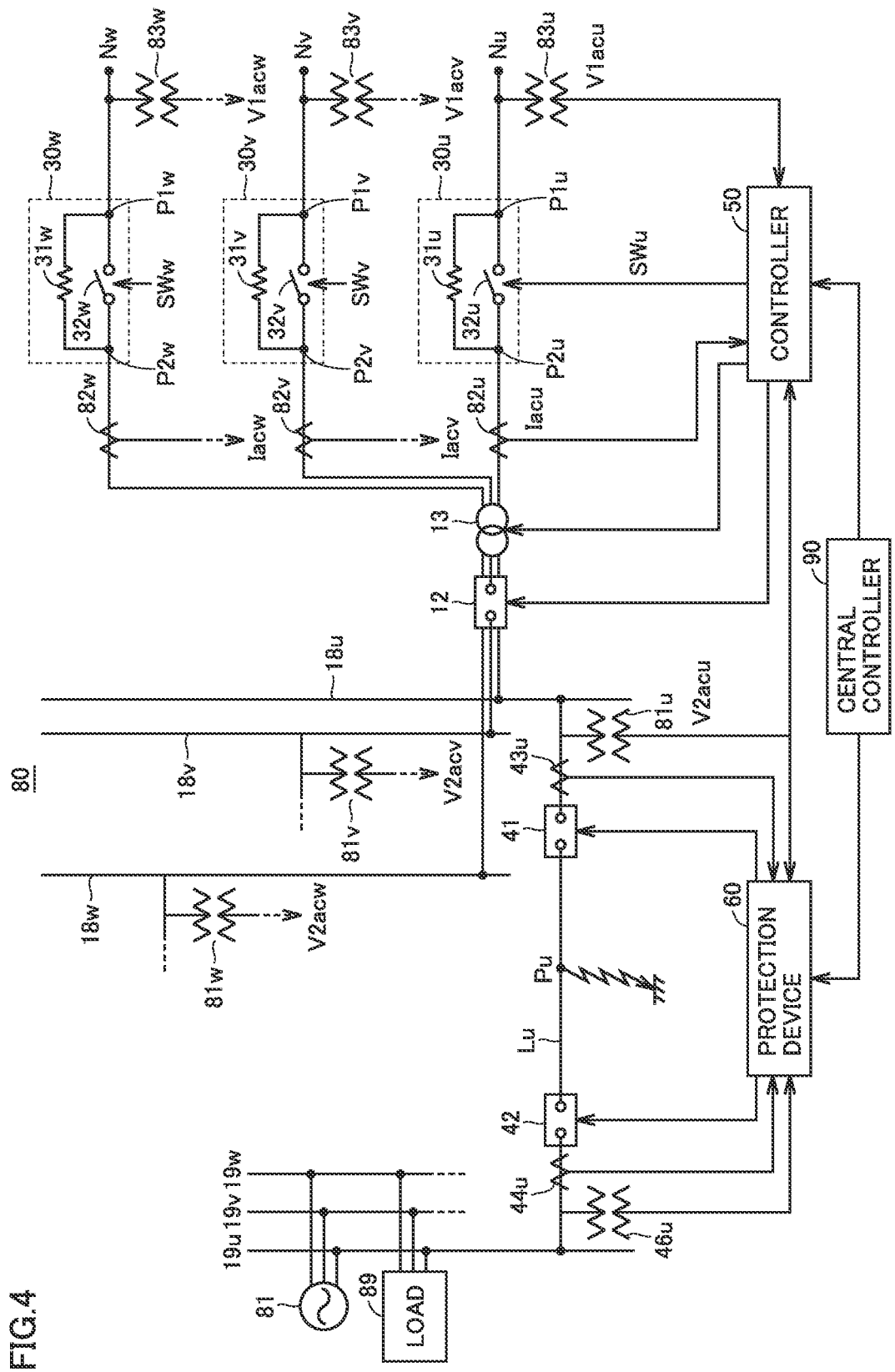
FIG. 4 is a diagram for illustrating a configuration of an AC system 80 and a configuration between AC system 80 and a power converter 2 in Embodiment 1.

FIG. 4 is a diagram for illustrating a configuration of AC system 80 and a configuration between AC system 80 and power converter 2 in Embodiment 1.

AC circuit breaker 12, transformer 13, and current control circuits 30u, 30v, 30w are connected in series between AC buses 18u, 18v, 18w and AC terminals Nu, Nv, Nw.

Current control circuit 30u includes a current-limiting resistor 31u and a disconnector 32u connected in parallel. Current control circuit 30v includes a current-limiting resistor 31v and a disconnector 32v connected in parallel. Current control circuit 30w includes a current-limiting resistor 31w and a disconnector 32w connected in parallel.

Controller 50 outputs switch signals SWu, SWv, SWw to disconnectors 32u, 32v, 32w, respectively. Controller 50 sets switch signal SWu to "1" in initial charge of power converter 2, thereby instructing disconnector 32u to open. Controller 50 sets switch signal SWu to "0" in operation after initial charge of power converter 2, thereby instructing disconnector 32u to close. Controller 50 sets switch signal SWv to "1" in initial charge of power converter 2, thereby instructing disconnector 32v to open. Controller 50 sets switch signal SWv to "0" in operation after initial charge of power converter 2, thereby instructing disconnector 32v to close. Controller 50 sets switch signal SWw to "1" in initial charge of power converter 2, thereby instructing disconnector 32w to open. Controller 50 sets switch signal SWw to "0" in operation after initial charge of power converter 2, thereby instructing disconnector 32w to close.

A voltage detector 83u detects a U-phase voltage V1acu of AC terminal Nu (first node) located on a first end Plu side of current control circuit 30u. A voltage detector 83v detects a V-phase voltage V1acv of AC terminal Nv (first node) located on a first end P1v side of current control circuit 30v. A voltage detector 83w detects a W-phase voltage V1acw of AC terminal Nw (first node) located on a first end P1w side of current control circuit 30w.

A voltage detector 81u detects a U-phase voltage V2acu of AC bus 18u (second node) located on a second end P2u side of current control circuit 30u. Voltage detector 81v detects a V-phase voltage V2acv of AC bus 18v (second node) located on a second end P2v side of current control circuit 30v. Voltage detector 81v detects a W-phase voltage V2acw of AC bus 18v (second node) located on a second end P2w side of current control circuit 30v.

A current detector 82u is disposed between a second end P2u of current control circuit 30u and transformer 13. Current detector 82u detects a U-phase current Iacu flowing between AC system 80 and power converter 2. A current detector 82v is disposed between a second end P2v of current control circuit 30v and transformer 13.

Current detector 82v detects a V-phase current Iacv flowing between AC system 80 and power converter 2. A current detector 82w is disposed between a second end P2w of current control circuit 30w and transformer 13. Current detector 82w detects a W-phase current Iacw flowing between AC system 80 and power converter 2.

AC system 80 includes AC buses 18u, 18v, 18w, AC buses 19u, 19v, 19w, power transmission lines Lu, Lv, Lw, a power generator 81, and a load 89. In FIG. 4, Lv, 43v, 44v of V-phase and Lw, 43w, 44w of W-phase are omitted.

AC buses 18u, 18v, 18w are connected to power converter 2 via AC circuit breaker 12, transformer 13, and current control circuits 30u, 30v, 30w.

Power transmission lines Lu, Lv, Lw are provided between AC buses 18u, 18v, 18w and AC buses 19u, 19v, 19w, respectively.

An AC circuit breaker 41 opens and closes between AC buses 18u, 18v, 18v and power transmission lines Lu, Lv, Lw. An AC circuit breaker 42 opens and closes between AC buses 19u, 19v, 19w and power transmission lines Lu, Lv, Lw. AC circuit breakers 41, 42 conduct or interrupt a current flowing through each of power transmission lines Lu, Lv, Lw in accordance with a control command from protection device 60.

Power generator 81 and load 89 are connected to AC buses 19u, 19v, 19w. Power generator 81 is, for example, a hydroelectric generator capable of activation in a relatively short period of time. Load 89 is, for example, a consumer, such as a factory or an ordinary household.

A voltage detector 46u detects a voltage of AC bus 19u. A voltage detector 46v detects a voltage of AC bus 19v. A voltage detector 46w detects a voltage of AC bus 19w.

Current detectors 43u, 44u detect a power transmission line current flowing through power transmission line Lu. Current detectors 43v, 44v (not shown) detect a power transmission line current flowing through power transmission line Lv. Current detectors 43w, 44w (not shown) detect a power transmission line current flowing through power transmission line Lw.

Protection device 60 obtains an amount of electricity (e.g., current, voltage) used for protection control of power transmission lines Lu, Lv, Lw. Protection device 60 obtains values of the power transmission line currents flowing from current detectors 43u, 44u to power transmission line Lu and obtains voltages of AC buses 18u, 19u from voltage detectors 81u, 46u. Protection device 60 obtains values of power transmission line currents flowing from current detectors 43v, 44v to power transmission line Lv and obtains voltages of AC buses 18v, 19v from voltage detectors 81v, 46v. Protection device 60 obtains values of power transmission line currents flowing through power transmission line Lw from current detectors 43w, 44w and obtains voltages of AC buses 18w, 19w from voltage detectors 81w, 46w. Protection device 60 performs a predetermined protection operation (relay operation) based on the amount of electricity, and when determining that a fault has occurred in the power transmission line based on the result of the protection operation, transmits a trip command to AC circuit breakers 41, 42, thereby opening AC circuit breakers 41, 42 (controlling AC breakers 41, 42 to turn off). Protection device 60 can use, for example, various operation elements such as an overcurrent relay, an overvoltage relay, an undervoltage relay, and a current differential relay as a relay operation element.

Figure 5:
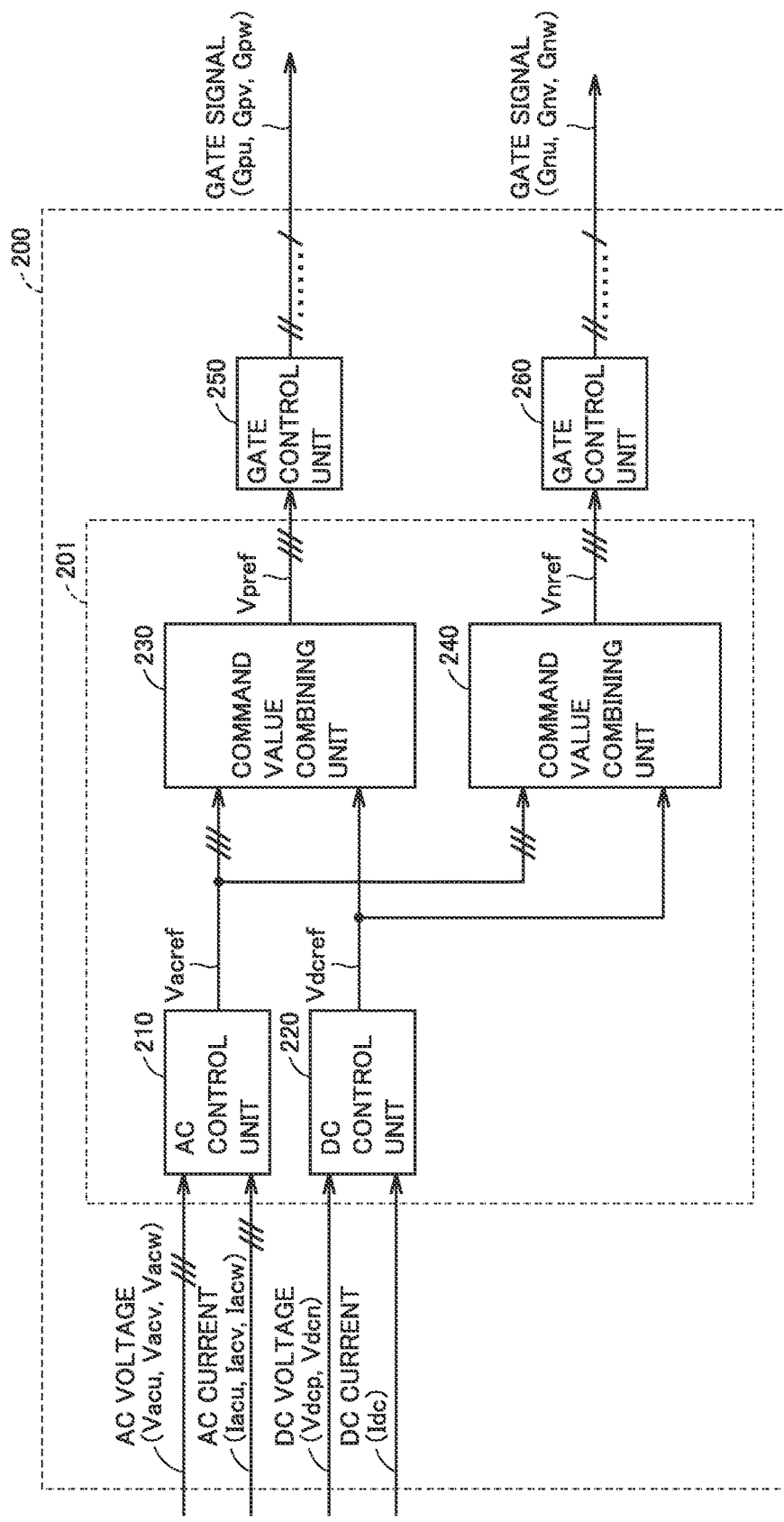
FIG. 5 is a block diagram of a power conversion control system 200 that implements some of control functions by a controller 50 in Embodiment 1.

FIG. 5 is a block diagram of a power conversion control system 200 that implements some of control functions by controller 50 in Embodiment 1. The functions of the respective blocks shown in FIG. 5 can be implemented through software processing and/or hardware processing by controller 50.

Power conversion control system 200 includes a voltage command value generation unit 201 and gate control units 250, 260.

Gate control unit 250 supplies gate signals Gpu, Gpv, Gpw to switching elements constituting positive-side converter cells of leg circuits 4u, 4v, 4w, respectively. Gate control unit 260 supplies gate signals Gnu, Gnv, Gnw to switching elements constituting negative-side converter cells of leg circuits 4u, 4v, 4w, respectively. Voltage command value generation unit 201 supplies voltage command values Vpref, Vnref to gate control units 250, 260, respectively. Voltage command value generation unit 201 includes an AC control unit 210, a DC control unit 220, and command value combining units 230, 240.

AC control unit 210 receives inputs of currents Iacu, Iacv, Iacw of U-phase, V-phase, and W-phase (when mentioned collectively, referred to as AC current Iac) detected by current detectors 82u, 82v, 82w, respectively, and voltages Vacu, Vacv, Vacw of U-phase, V-phase, and W-phase (when mentioned collectively, referred to as AC voltage Vac) detected by voltage detectors 83u, 83v, 83w, respectively. AC control unit 210 generates AC voltage command values Vacrefu, Vacrefv, Vacref of U-phase, V-phase, and W-phase (when mentioned collectively, referred to as AC voltage command value Vacref) based on AC current Iac and AC voltage Vac.

DC control unit 220 receives inputs of DC current Idc detected by DC current detector 16, DC voltage Vdcp detected by DC voltage detector 11A, and DC voltage Vdcn detected by DC voltage detector 11B. DC control unit 220 generates a DC voltage command value Vdcref based on the input DC voltages Vdcp, Vdcn and DC current Idc.

Command value combining unit 230 combines AC voltage command value Vacrefu of U-phase and DC voltage command value Vdcref, thereby generating a voltage command value Vprefu for submodule 7 on the positive side of U-phase. Command value combining unit 230 combines AC voltage command value Vacrefv of V-phase and DC voltage command value Vdcref, thereby generating a voltage command value Vprefv for submodule 7 on the positive side of V-phase. Command value combining unit 230 combines AC voltage command value Vacrefw of W-phase and DC voltage command value Vdcref, thereby generating a voltage command value Vprefw for submodule 7 on the positive side of W-phase. The generated voltage command values Vprefu, Vprefv, Vprefw (when mentioned collectively or non-specifically, referred to as voltage command value Vpref) are input to gate control unit 250.

Command value combining unit 240 combines AC voltage command value Vacrefu of U-phase and DC voltage command value Vdcref, thereby generating a voltage command value Vnrefu for submodule 7 on the negative side of U-phase. Command value combining unit 240 combines AC voltage command value Vacrefv of V-phase and DC voltage command value Vdcref, thereby generating a voltage command value Vnrefv for submodule 7 on the negative side of V-phase. Command value combining unit 240 combines AC voltage command value Vacrefw of W-phase and DC voltage command value Vdcref, thereby generating a voltage command value Vnrefw for submodule 7 on the negative side of W-phase. The generated voltage command values Vnrefu, Vnrefv, Vnrefw (when mentioned collectively or non-specifically, referred to as voltage command value Vnref) are input to gate control unit 260.

Based on voltage command values Vprefu, Vprefv, Vprefw of U-phase, V-phase, and W-phase combined in command value combining unit 230, gate control unit 250 supplies the switching elements constituting submodules 7 on the positive side of the respective phases with corresponding gate signals Gpu, Gpv, Gpw.

Based on voltage command values Vnrefu, Vnrefv, Vnrefw of U-phase, V-phase, and W-phase combined in command value combining unit 240, gate control unit 260 supplies the switching elements constituting submodules 7 on the negative side of the respective phases with corresponding gate signals Gnu, Gnv, Gnw.

Figure 6:
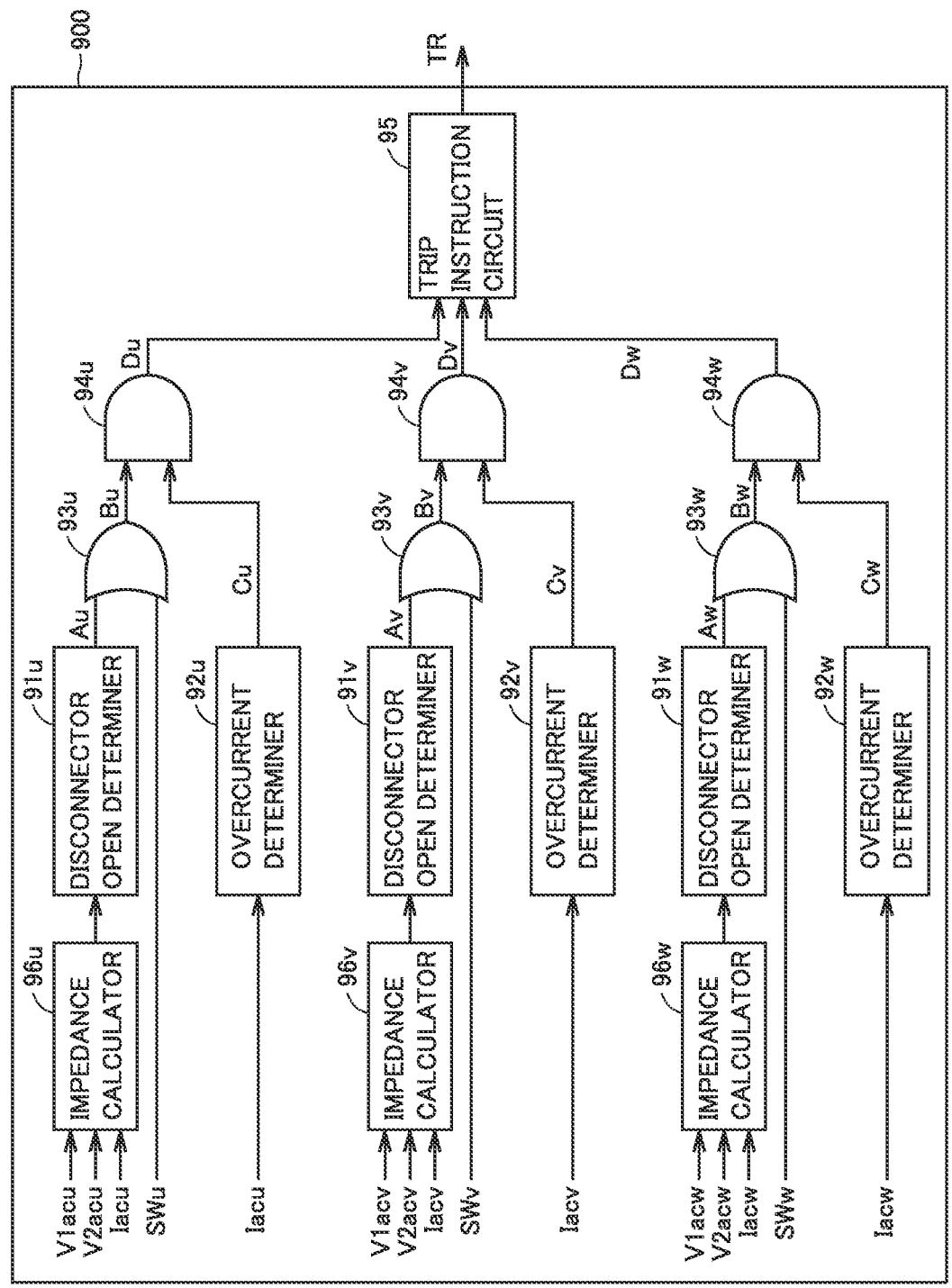
FIG. 6 is a block diagram of a trip control system 900 that implements some of the control functions by controller 50 in Embodiment 1.

FIG. 6 is a block diagram of a trip control system 900 that implements some of control functions by controller 50 in Embodiment 1. The functions of the respective blocks shown in FIG. 6 can be implemented through software processing and/or hardware processing by controller 50.

Trip control system 900 includes impedance calculators 96u, 96v, 96w, disconnector open determiners 91u, 91v, 91w, first logic circuits 93u, 93v, 93w, second logic circuits 94u, 94v, 94, and a trip instruction circuit 95.

Impedance calculator 96u calculates an impedance Ru of a path between AC bus 18u and AC terminal Nu based on voltage V1acu of AC terminal Nu which is detected by voltage detector 83u, voltage V2acu of AC bus 18u which is detected by voltage detector 81u, and current Iacu of U-phase flowing between AC system 80 and power converter 2 which is detected by current detector 82u, in accordance with the following equations.

$$\Delta Vu = V1acu - V2acu \quad (A1)$$

$$Zu = \Delta Vu / Iacu \quad (A2)$$

$$\Delta Vu = |\Delta Vu|\{\cos(\theta 1u) + i\sin(\theta 1u)\} \quad (A3)$$

$$Iacu = |Iacu|\{\cos(\theta 2u) + i\sin(\theta 2u)\} \quad (A4)$$

$$Ru = |Zu|\cos(\theta 1u - \theta 2u) \quad (A5)$$

$$|Zu| = |\Delta Vu|/|Iacu| \quad (A6)$$

In Equations (A3) to (A6), |X| indicates an absolute value of X.

When impedance Ru of the path between AC bus 18u and AC terminal Nu is not less than a reference value TH1u, disconnector open determiner 91u determines that disconnector 32u is open, and then, sets an open determination signal Au to "1". When impedance Ru of the path between AC bus 18u and AC terminal Nu is less than reference value TH1u, disconnector open determiner 91u determines that disconnector 32u is closed, and then, sets open determination signal Au to "0".

Herein, Ru0<TH1u≤Ru1. The state in which disconnector 32u is open includes a state in which disconnector 32u is completely opened in accordance with switch signal SWu for instructing disconnector 32u to open because disconnector 32u is in normal operation, and a state in which disconnector 32u is not completely closed irrespective of switch signal SWu for instructing disconnector 32u to close because disconnector 32u has an abnormality.

A value of impedance Ru when disconnector 32u is completely closed is Ru0. When disconnector 32u is completely closed, a current mostly flows through disconnector 32u within current control circuit 30u. The value of impedance Ru when disconnector 32u is completely open is Ru1. When disconnector 32u is completely open, a current flows through only current-limiting resistor 31u within current control circuit 30u.

First logic circuit 93u outputs a disconnector state signal Bu, which is a logical sum of switch signal SWu and open determination signal Au. In initial charge of power converter 2, when switch signal SWu is set to "1" to instruct disconnector 32u to open, disconnector state signal Bu is "1". In operation after initial charge of power converter 2, when it is determined that disconnector 32u is open due to an abnormality of disconnector 32u even though switch signal SWu is set to "0" to instruct disconnector 32u to close, disconnector state signal Bu is "1".

When an accumulated value of current Iacu of U-phase flowing between AC system 80 and power converter 2 within a certain period of time, which is detected by current detector 82u, is not less than a reference value TH2u, overcurrent determiner 92u determines that an overcurrent of U-phase has flowed between AC system 80 and power converter 2. When an accumulated value of current Iacu of U-phase flowing between AC system 80 and power converter 2 within the certain period of time, which is detected by current detector 82u, is less than reference value TH2u, overcurrent determiner 92u determines that no overcurrent of U-phase has flowed between AC system 80 and power converter 2. For example, overcurrent determiner 92u may include a counter, and the counter may count the magnitude of current Iacu within a certain period of time, and a count value may be reset after a lapse of the certain period of time.

Overcurrent determiner 92u sets an overcurrent determination signal Cu to "1" when determining that an overcurrent has flowed, and sets overcurrent determination signal Cu to "0" when determining that no overcurrent has flowed.

Second logic circuit 94u outputs a U-phase determination signal Du, which is a logical sum of disconnector state signal Bu and overcurrent determination signal Cu. When it is determined that disconnector 32u is open in initial charge of power converter 2 or in operation of power converter 2 (condition 1u), and when an overcurrent of U-phase flows between AC system 80 and power converter 2 (condition 2u), U-phase determination signal Du is "1".

Impedance calculator 96v calculates impedance Rv of a path between AC bus 18v and AC terminal Nv based on voltage V1acv of AC terminal Nv which is detected by voltage detector 83v, voltage V2acv of AC bus 18v which is detected by voltage detector 81v, and current Iacv of V-phase flowing between AC system 80 and power converter 2 which is detected by current detector 82v in accordance with the following equations.

$$\Delta Vv = V1acv - V2acv \tag{B1}$$

$$Zv = \Delta Vv/Iacv \tag{B2}$$

$$\Delta Vv = |\Delta Vv|\{\cos(\theta 1v) + i\sin(f1v)\} \tag{B3}$$

$$Iacv = |Iacv|\{\cos(\theta 2v) + i\sin(\theta 2v)\} \tag{B4}$$

$$Rv = |Zv|\cos(\theta 1v - \theta 2v) \tag{B5}$$

$$|Zv| = |\Delta Vv|/|Iacv| \tag{B6}$$

When impedance Rv of the path between AC bus 18v and AC terminal Nv is not less than a reference value TH1v, disconnector open determiner 91v determines that disconnector 32v is open, and sets an open determination signal Av to "1". When impedance Rv of the path between AC bus 18v and AC terminal Nv is less than reference value TH1v, disconnector open determiner 91v determines that disconnector 32v is closed, and sets open determination signal Av to "0".

Herein, Rv0<TH1v≤Rv1. The state in which disconnector 32v is open includes a state in which disconnector 32v is completely opened in accordance with switch signal SWv for instructing disconnector 32v to open because disconnector 32v is in normal state and a state in which disconnector 32v is not completely closed irrespective of switch signal SWv for instructing disconnector 32v to close because disconnector 32v has an abnormality.

The value of impedance Rv when disconnector 32v is completely closed is Rv0. When disconnector 32v is completely closed, a current mostly flows through disconnector 32v within current control circuit 30v. The value of impedance Rv when disconnector 32v is completely open is Rv1. When disconnector 32v is completely open, a current flows through only current-limiting resistor 31v within current control circuit 30v.

First logic circuit 93v outputs a disconnector state signal Bv, which is a logical sum of switch signal SWv and open determination signal Av. In initial charge of power converter 2, when switch signal SWv is set to "1" in order to instruct disconnector 32v to open, disconnector state signal Bv is "1". In operation after initial charge of power converter 2, when it is determined that disconnector 32v is open due to an abnormality of disconnector 32v even though switch signal SWv is set to "0" to instruct disconnector 32v to close, disconnector state signal By is "1".

When an accumulated value of current Iacy of V-phase flowing between AC system 80 and power converter 2 within a certain period of time, which is detected by current detector 82v, is not less than a reference value TH2v, overcurrent determiner 92v determines that an overcurrent of V-phase has flowed between AC system 80 and power converter 2. When an accumulated value of current Iacy of V-phase flowing between AC system 80 and power converter 2 within the certain period of time, which is detected by current detector 82v, is less than reference value TH2v, overcurrent determiner 92v determines that no overcurrent of V-phase has flowed between AC system 80 and power converter 2.

Overcurrent determiner 92v sets an overcurrent determination signal Cv to "1" when determining that an overcurrent has flowed and sets overcurrent determination signal Cv to "0" when determining that no overcurrent has flowed.

Second logic circuit 94v outputs a V-phase determination signal Dv, which is a logical sum of disconnector state signal Bv and overcurrent determination signal Cv. When it is determined that disconnector 32v is open in initial charge of power converter 2 or in operation of power converter 2 (condition 1v), and when an overcurrent of V-phase flows between AC system 80 and power converter 2 (condition 2v), V-phase determination signal Dv is "1".

Impedance calculator 96w calculates an impedance Rw of a path between AC bus 18w and AC terminal Nw based on voltage V1acw of AC terminal Nw which is detected by voltage detector 83w, voltage V2acw of AC bus 18w which is detected by voltage detector 81w, and current Iacw of W-phase flowing between AC system 80 and power converter 2 which is detected by current detector 82w in accordance with the following equations.

$$\Delta Vw = V1acw - V2acw \tag{C1}$$

$$Zw = \Delta Vw/Iacw \tag{C2}$$

$$\Delta Vw = |\Delta Vw|\{\cos(\theta 1w) + i\sin(\theta 1w)\} \tag{C3}$$

$$Iacw = |Iacw|\{\cos(\theta 2w) + i\sin(\theta 2w)\} \tag{C4}$$

$$Rw = |Zw|\cos(\theta 1w - \theta 2w) \tag{C5}$$

$$|Zw| = |\Delta Vw|/|Iacw| \tag{C6}$$

When impedance Rw of the path between AC bus 18u and AC terminal Nw is not less than a reference value TH1w, disconnector open determiner 91w determines that disconnector 32w is open, and sets an open determination signal Aw to "1". When impedance Rw of the path between AC bus 18w and AC terminal Nw is less than reference value TH1w, disconnector open determiner 91w determines that disconnector 32w is closed, and sets open determination signal Aw to "0".

Herein, Rw0<TH1w≤Rw1. The state in which disconnector 32w is open includes a state in which disconnector 32w is completely opened in accordance with switch signal SWw for instructing disconnector 32 to open because disconnector 32w is in normal sate and a state in which disconnector 32w is not completely closed irrespective of switch signal SWw for instructing disconnector 32w to close because disconnector 32w has an abnormality.

The value of impedance Rw when disconnector 32w is completely closed is Rw0. When disconnector 32w is completely closed, a current mostly flows through disconnector 32w within current control circuit 30w. The value of impedance Rw when disconnector 32w is completely open is Rw1. When disconnector 32w is completely open, a current flows through only current-limiting resistor 31w within current control circuit 30w.

First logic circuit 93w outputs a disconnector state signal Bw, which is a logical sum of switch signal SWw and open determination signal Aw. In initial charge of power converter 2, when switch signal SWw is set to "1" in order to instruct disconnector 32w to open, disconnector state signal Bw is "1". In operation after initial charge of power converter 2, when it is determined that disconnector 32w is open due to an abnormality of disconnector 32w even though switch signal SWw is set to "0" to instruct disconnector 32w to close, disconnector state signal Bw is "1".

When an accumulated value of current Iacw of W-phase flowing between AC system 80 and power converter 2 within a certain period of time, which is detected by current detector 82w, is not less than a reference value TH2w, overcurrent determiner 92w determines that an overcurrent of W-phase has flowed between AC system 80 and power converter 2. When an accumulated value of current Iacw of W-phase flowing between AC system 80 and power converter 2 within the certain period of time, which is detected by current detector 82w, is less than reference value TH2w, overcurrent determiner 92w determines that no overcurrent of W-phase has flowed between AC system 80 and power converter 2.

Overcurrent determiner 92w sets an overcurrent determination signal Cw to "1" when determining that an overcurrent has flowed and sets overcurrent determination signal Cw to "0" when determining that no overcurrent has flowed.

Second logic circuit 94w outputs a W-phase determination signal Dw, which is a logical sum of disconnector state signal Bw and overcurrent determination signal Cw. When it is determined that disconnector 32w is open in initial charge of power converter 2 or in operation of power converter 2 (condition 1w), and when an overcurrent of W-phase flows between AC system 80 and power converter 2 (condition 2w), W-phase determination signal Dw is "1".

When at least one of U-phase determination signal Du, V-phase determination signal Dv, and W-phase determination signal Dw is set to "1", trip instruction circuit 95 sets a trip instruction signal TR to "1". When all of U-phase determination signal Du, V-phase determination signal Dv, and W-phase determination signal Dw are set to "0", trip instruction circuit 95 sets trip instruction signal TR to "0". Trip instruction signal TR is sent to AC circuit breaker 12. When trip instruction signal TR is "1", AC circuit breaker 12 is opened. When trip instruction signal TR is "0", AC circuit breaker 12 is closed.

(Hardware Configuration of Controller 50)

Figure 7:
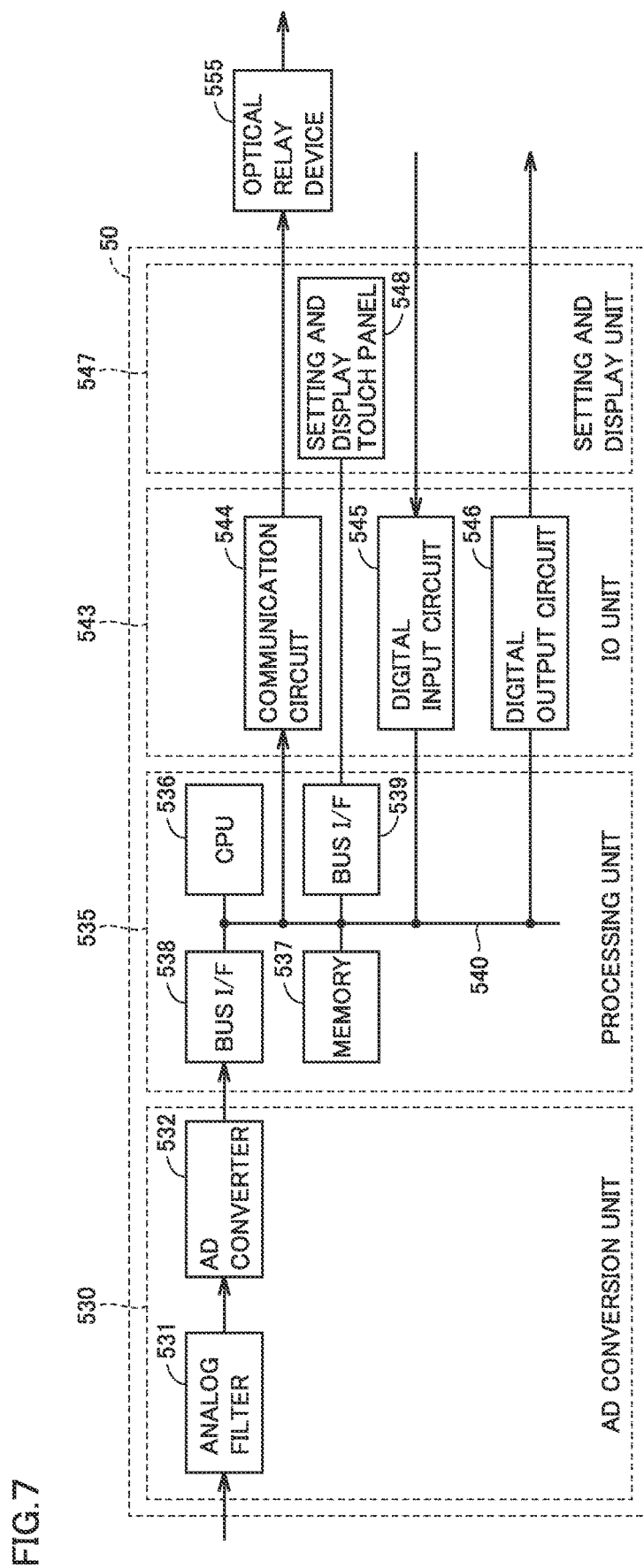
FIG. 7 is a block diagram showing an example hardware configuration of controller 50.

FIG. 7 is a block diagram showing an example hardware configuration of controller 50.

Controller 50 is similar in configuration to a so-called digital relay device. Controller 50 includes an AD (analog-digital) conversion unit 530, a processing unit 535, an IO (input and output) unit 543, and a setting and display unit 547.

At a previous stage to AD conversion unit 530, a plurality of transformers (not shown) may be provided that serve to convert signals input from arm current detectors 9a, 9b, voltage detectors 83u, 83v, 83w, voltage detectors 81u, 81v, 81w, current detectors 82u, 82v, 82w, DC current detector 16, and DC voltage detectors 11a, 11b into voltage levels suitable for signal processing within controller 50.

AD conversion unit 530 includes an analog filter 531 and an AD converter 532. Analog filter 531 is a low-pass filter provided for removing an aliasing error in AD conversion. AD converter 532 converts a signal which has passed through analog filter 531 into a digital value.

Although FIG. 7 representatively shows one channel for an input to AD conversion unit 530, in actuality, a multi-input configuration is provided for receiving signals from the respective detectors. More specifically, AD conversion unit 530 thus includes a plurality of analog filters 531 and a multiplexer (not shown) for selecting signals which have passed through analog filters 531.

Processing unit 535 includes a CPU (Central Processing Unit) 536, a memory 537, bus interfaces 538, 539, and a bus 540, which connects these components. CPU 536 controls the overall operation of controller 50. Memory 537 is used as a main memory of CPU 536. Memory 537, which further includes a nonvolatile memory such as a flash memory, stores programs, settings for signal processing, and/or the like.

It suffices that processing unit 535 is formed of a circuit having a processing function and is not limited to the example of FIG. 7. For example, processing unit 535 may include a plurality of CPUs. Alternatively, processing unit 535 may be formed of at least one ASIC (Application Specific Integrated Circuit) in place of a processor such as CPU, or may be formed of at least one FPGA (Field Programmable Gate Array).

Still alternatively, processing unit 535 may be formed of any combination of a processor, an ASIC, and an FPGA.

IO unit 543 includes a communication circuit 544, a digital input circuit 545, and a digital output circuit 546. Communication circuit 544 generates an optical signal for outputting to each converter cell 7. The signal output from communication circuit 544 is transmitted through an optical relay device 555 to submodule 7. Digital input circuit 545 and digital output circuit 546 are interface circuits in communication between CPU 536 and an external device. For example, digital output circuit 546 outputs a trip signal to AC circuit breaker 12.

Setting and display unit 547 includes a touch panel 548 for input and display of a setting value. Touch panel 548 is an input-output interface having a combination of a display device such as a liquid crystal panel and an input device such as a touch pad. Touch panel 548 is connected to bus 540 via bus interface 539.

As described above, the present embodiment can prevent an excessive current from flowing through a current-limiting resistor by opening an AC circuit breaker based on an impedance of a line between a first node located on a first end side of a current control circuit and a second node located on a second end side of the current control circuit and a current flowing through the current control circuit. In the present embodiment, an impedance is calculated using one current detector for determining whether a current has flowed through a current-limiting resistor and two voltage detectors. These detectors can also be used for another type of control, eliminating the need for providing a detector only for determining whether a current has flowed through the current-limiting resistor. For example, if a current detector is provided in series with a current-limiting resistor for determining whether a current has flowed through the current-limiting resistor, this current detector cannot be used for another type of control.

Embodiment 2

Figure 8:
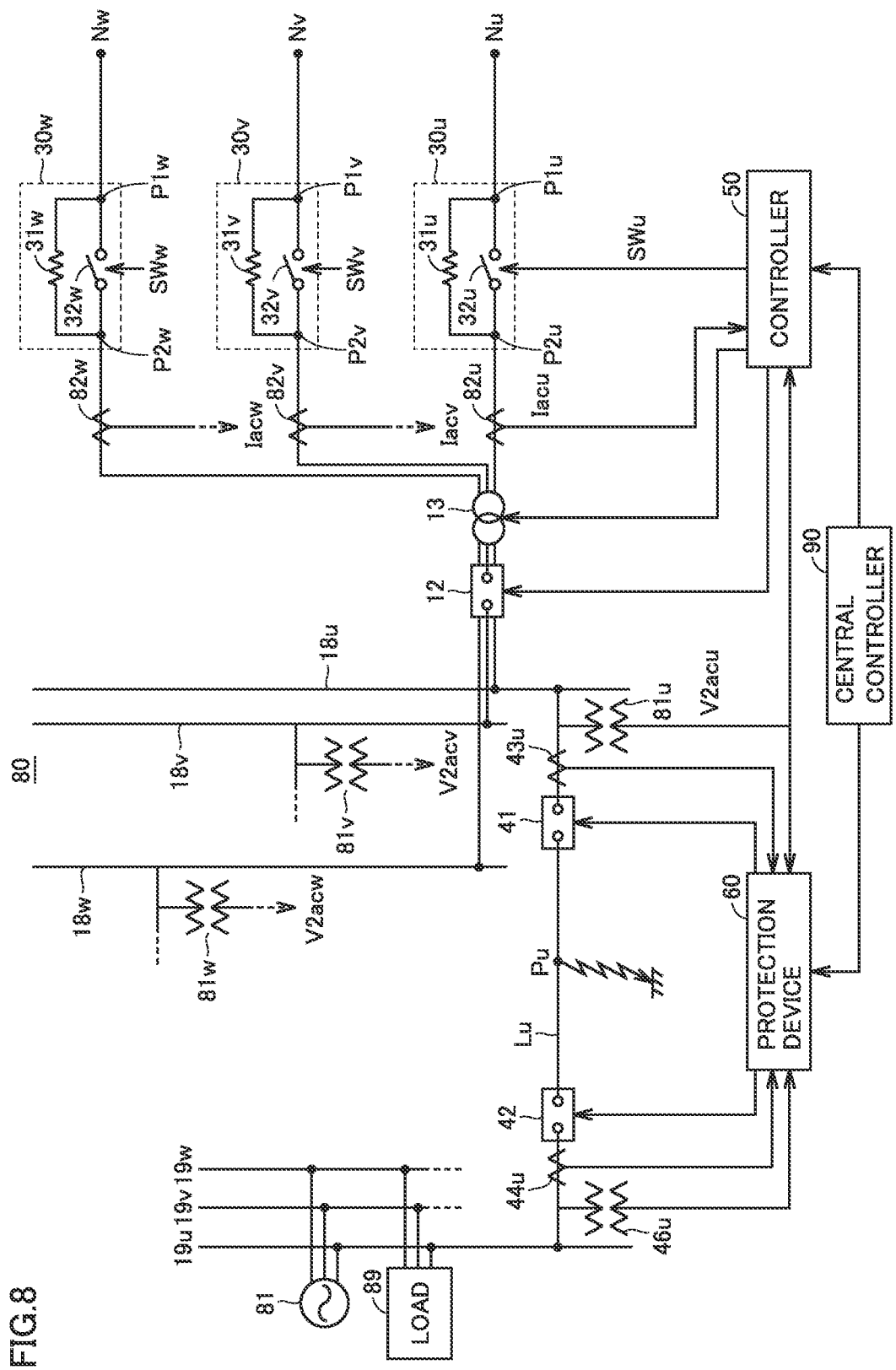
FIG. 8 is a diagram for illustrating a configuration of an AC system 80 and a configuration between AC system 80 and a power converter 2 in Embodiment 2.

FIG. 8 is a diagram for illustrating a configuration of AC system 80 and a configuration between AC system 80 and power converter 2 in Embodiment 2.

A power control system of Embodiment 2 is different from the power control system of Embodiment 1 in that voltage detectors 83u, 83v, 83w are not provided. In Embodiment 2, controller 50 controls AC circuit breaker 12 to close and open using AC voltage command values Vacrefu, Vacrefv, Vacref calculated by controller 50, in place of the detected voltages V1acu, V1acv, V1acw of AC terminals Nu, Nv, Nw.

Since voltage detectors 83u, 83v, 83w are not provided in the present embodiment, a power conversion control system is different from power conversion control system 200 of Embodiment 1.

Figure 9:
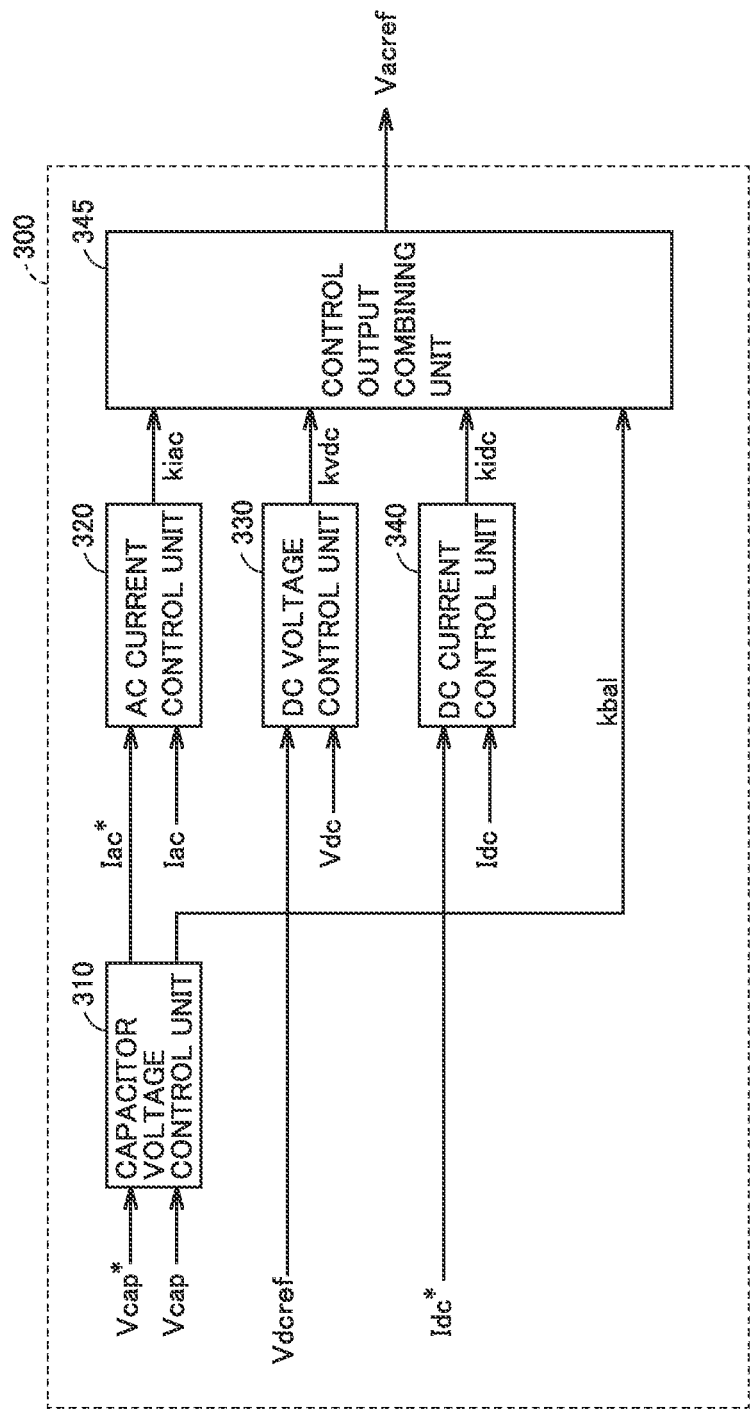
FIG. 9 is a block diagram of a power conversion control system 300 that implements some of control functions by a controller 50 in Embodiment 2.

FIG. 9 is a block diagram of a power conversion control system 300 that implements some of control functions by controller 50 in Embodiment 2. The functions of the respective blocks shown in FIG. 9 can be implemented through software processing and/or hardware processing by controller 50.

Power conversion control system 300 includes a capacitor voltage control unit 310, an AC current control unit 320, a DC voltage control unit 330, a DC current control unit 340, and a control output combining unit 345.

Capacitor voltage control unit 310 performs a control computation for charging and discharging so as to cause a capacitor voltage Vcap of DC capacitor 24 in each converter cell 7 to follow a capacitor voltage command value Vcap*, based on a detected value by the voltage detection unit disposed in each converter cell 7, thereby generating a voltage balance control command kbal and an AC current command value Iac*. In power converter 2, capacitor voltage Vcap in each converter cell 7 varies in accordance with the balance of power transmitted and received between AC system 80 and DC power transmission lines 14P, 14N. Capacitor voltage control unit 310 generates AC current command value Iac* of AC current Iac for causing an average value of the detected capacitor voltages Vcap to match capacitor voltage command value Vcap*.

AC current control unit 320 performs a control computation for causing AC currents Iac flowing into or out of AC terminals Nu, Nv, Nw to follow AC current command value Iac* from capacitor voltage control unit 310, thereby generating an AC current control command kiac. AC currents Iac (current Iacu of U-phase, current Iacv of V-phase, and current Iacw of W-phase) are detected by current detectors 82u, 82v, 82w.

DC voltage control unit 330 performs a control computation for causing a DC voltage Vdc, which is a difference between DC voltage Vdcp detected by DC voltage detector 11A and DC voltage Vdcn detected by DC voltage detector 11B, to follow DC voltage command value Vdcref, thereby generating a DC voltage control command kvdc.

DC current control unit 340 performs a control computation for causing DC current Idc detected by DC current detector 16 to follow a DC current command value Idc*, thereby generating a DC current control command kidc.

Control output combining unit 345 combines AC current control command kiac from AC current control unit 320, DC voltage control command kvdc from DC voltage control unit 330, DC current control command kidc from DC current control unit 340, and voltage balance control command kbal from capacitor voltage control unit 310, thereby generating AC voltage command values Vacrefu, Vacrefv, Vacrefw of U-phase, V-phase, and W-phase.

In accordance with a voltage command output from control output combining unit 345, a gate control signal (not shown) for controlling each semiconductor switching element to turn on and off to control a voltage output from each converter cell 7 is generated.

Figure 10:
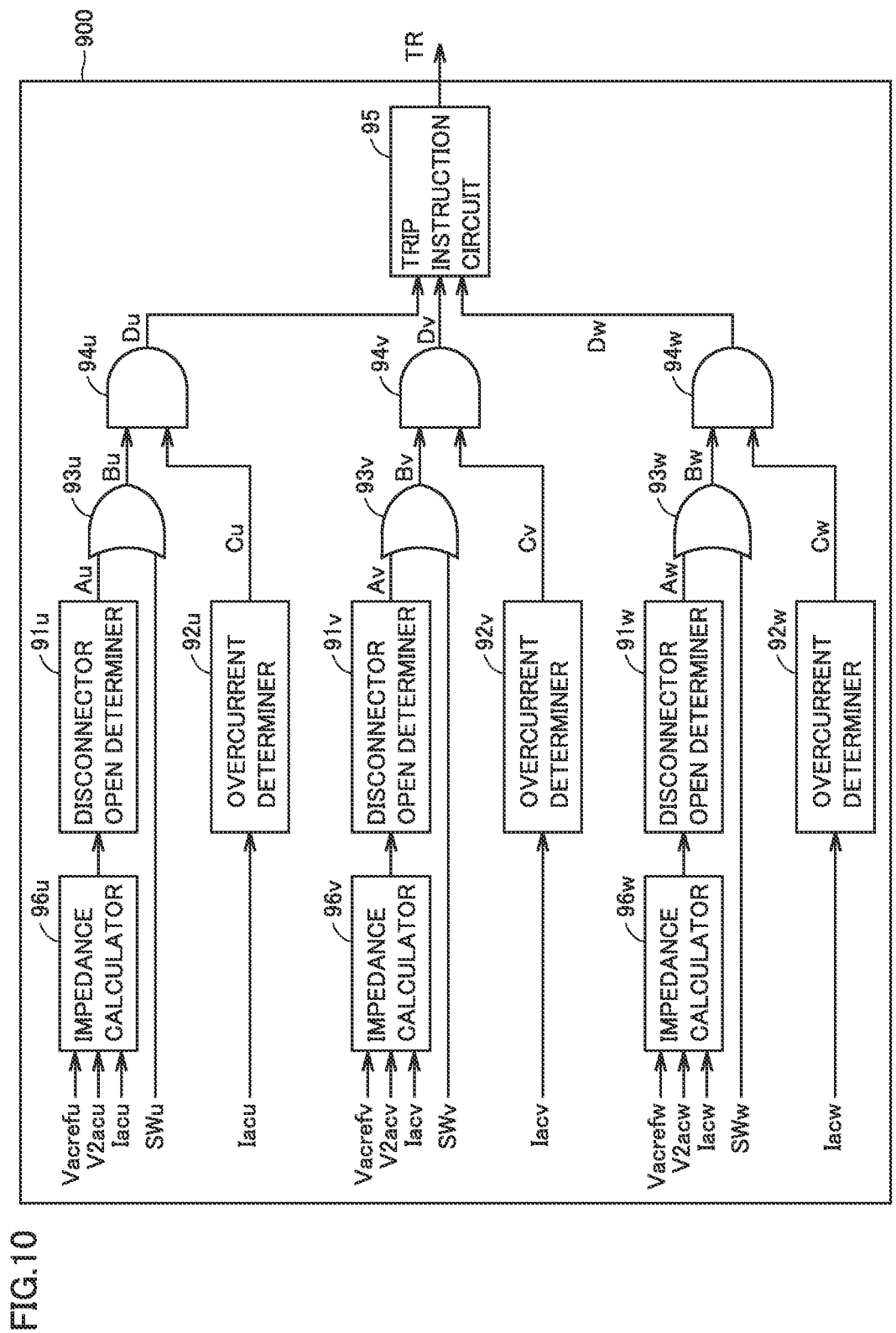
FIG. 10 is a block diagram of a trip control system 900 that implements some of the control functions by controller 50 in Embodiment 2.

FIG. 10 is a block diagram of trip control system 900 that implements some of control functions by controller 50 in Embodiment 2. The functions of the respective blocks shown in FIG. 10 can be implemented through software processing and/or hardware processing by controller 50. Trip control system 900 of FIG. 10 is different from trip control system 900 of Embodiment 1 shown in FIG. 6 in inputs of impedance calculators 96u, 96v, 96w.

Impedance calculator 96u calculates impedance Ru of the path between AC bus 18u and AC terminal Nu based on AC voltage command value Vacrefu of U-phase which is calculated by controller 50, voltage V2acu of AC bus 18u which is detected by voltage detector 81u, and current Iacu of U-phase flowing between AC system 80 and power converter 2 which is detected by current detector 82u in accordance with the following equations.

$$\Delta Vu = Vacrefu - V2acu \tag{D1}$$

$$Zu = \Delta Vu / Iacu \tag{D2}$$

$$Vu = |\Delta Vu|\{\cos(\theta 1u) + i\sin(\theta 1u)\} \tag{D3}$$

$$Iacu = |\Delta Vu|\{\cos(\theta 2u) + i\sin(\theta 2u)\} \tag{D4}$$

$$Ru = |Zu|\cos(\theta 1u - \theta 2u) \tag{D5}$$

$$|Zu| = |\Delta Vu|/|Iacu| \tag{D6}$$

Impedance calculator 96v calculates impedance Rv of the path between AC bus 18v and AC terminal Nv based on AC voltage command value Vacrefv of V-phase which is calculated by controller 50, voltage V2acv of AC bus 18v which is detected by voltage detector 81v, and current Iacv of V-phase flowing between AC system 80 and power converter 2 which is detected by current detector 82v in accordance with the following equations.

$$\Delta Vv = Vacrefv - V2acv \tag{E1}$$

$$Zv = \Delta Vv / Iacv \tag{E2}$$

$$\Delta Vv = |\Delta Vv|\{\cos(\theta 1v) + i\sin(\theta 1v)\} \tag{E3}$$

$$Iacv = |Iacv|\{\cos(\theta 2v) + i\sin(\theta 2v)\} \tag{E4}$$

$$Rv = |Zu|\cos(\theta 1v - \theta 2v) \tag{E5}$$

$$|Zv| = |\Delta Vv|/|Iacv| \tag{E6}$$

Impedance calculator 96w calculates impedance Rw of the path between AC bus 18w and AC terminal Nw based on AC voltage command value Vacrefw of W-phase which is calculated by controller 50, voltage V2acw of AC bus 18w which is detected by voltage detector 81w, and current Iacw of W-phase flowing between AC system 80 and power converter 2 which is detected by current detector 82w in accordance with the following equations.

$$\Delta Vw = Vacrefw - V2acw \tag{F1}$$

$$Zw = \Delta Vw / Iacw \tag{F2}$$

$$\Delta Vw = |\Delta Vw|\{\cos(\theta 1w) + i\sin(\theta 1w)\} \tag{F3}$$

$$Iacw = |Iacw|\{\cos(\theta 2w) + i\sin(\theta 2w)\} \tag{F4}$$

$$Rw = |Zw|\cos(\theta 1w - \theta 2w) \tag{F5}$$

$$|Zw| = |\Delta Vw|/|Iacw \tag{F6}$$

Similarly to Embodiment 1, the present embodiment can prevent an excessive current from flowing through a current-limiting resistor by opening an AC circuit breaker based on an impedance of a line between a first node located on a first end side of a current control circuit and a second node located on a second end side of the current control circuit and a current flowing through the current control circuit. Further, the present embodiment can obtain an impedance using one voltage detector and one current detector, leading to fewer voltage sensors than in Embodiment 1.

Embodiment 3

Figure 11:
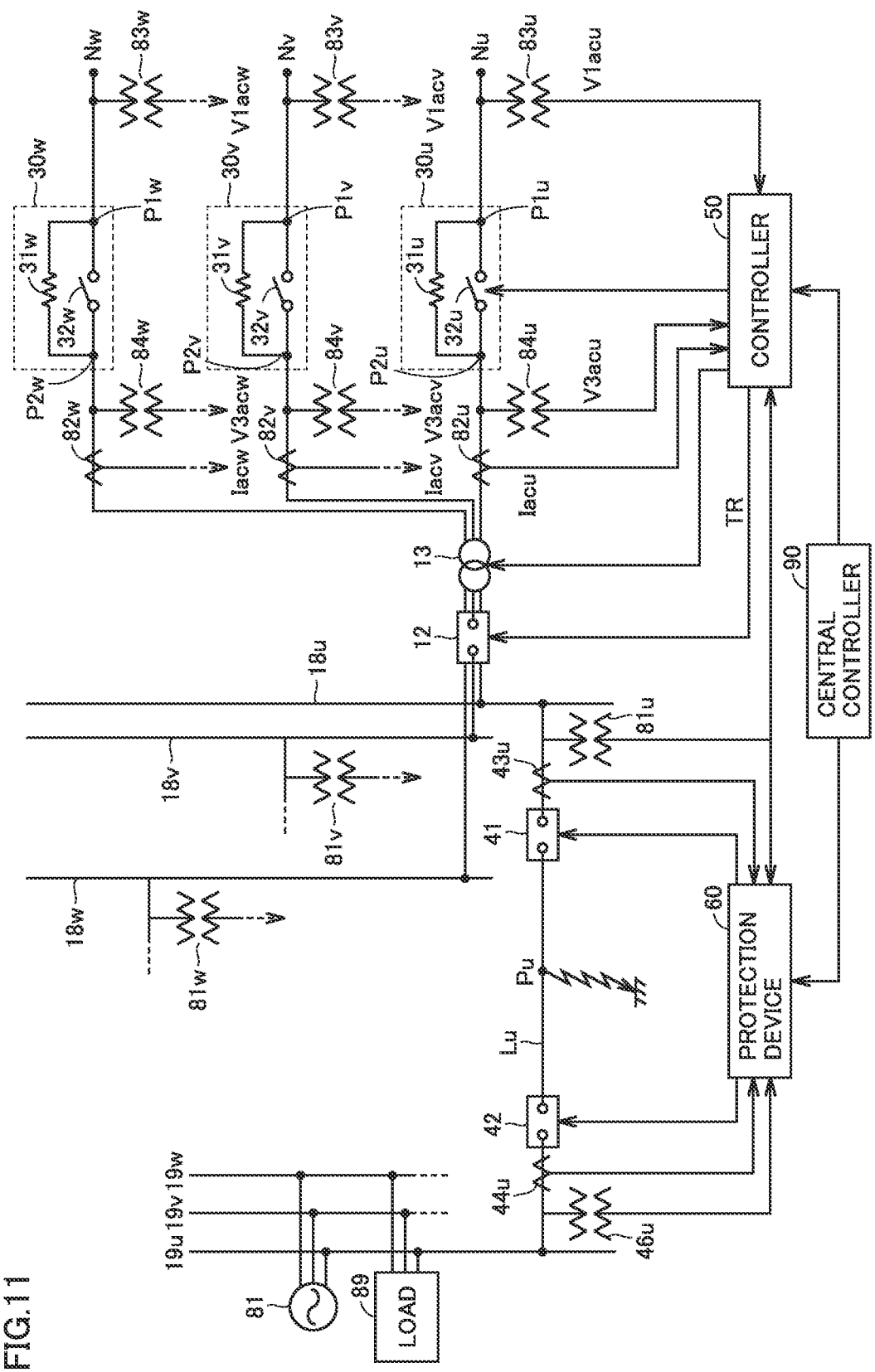
FIG. 11 is a diagram for illustrating a configuration of an AC system 80 and a configuration between AC system 80 and a power converter 2 in Embodiment 3.

FIG. 11 is a diagram for illustrating a configuration of AC system 80 and a configuration between AC system 80 and power converter 2 in Embodiment 3.

A power control system of Embodiment 3 is different from the power control system of Embodiment 1 in that voltage detectors 84u, 84v, 84w are provided.

Voltage detector 84u detects a voltage V3acu of U-phase at second end P2u (second node) of current control circuit 30u. Voltage detector 84v detects a voltage V3acv of V-phase at second end P2v (second node) of current control circuit 30v. Voltage detector 84w detects a voltage V3acw of W-phase at second P2w (second node) of current control circuit 30w. In Embodiment 3, controller 50 controls AC circuit breaker 12 to close and open using voltages V3acu, V3acv, V3acw detected by voltage detectors 84u, 84v, 84w, in place of voltages V2acu, V2acv, V2acw detected by voltage detectors 81u, 81v, 81w.

Figure 12:
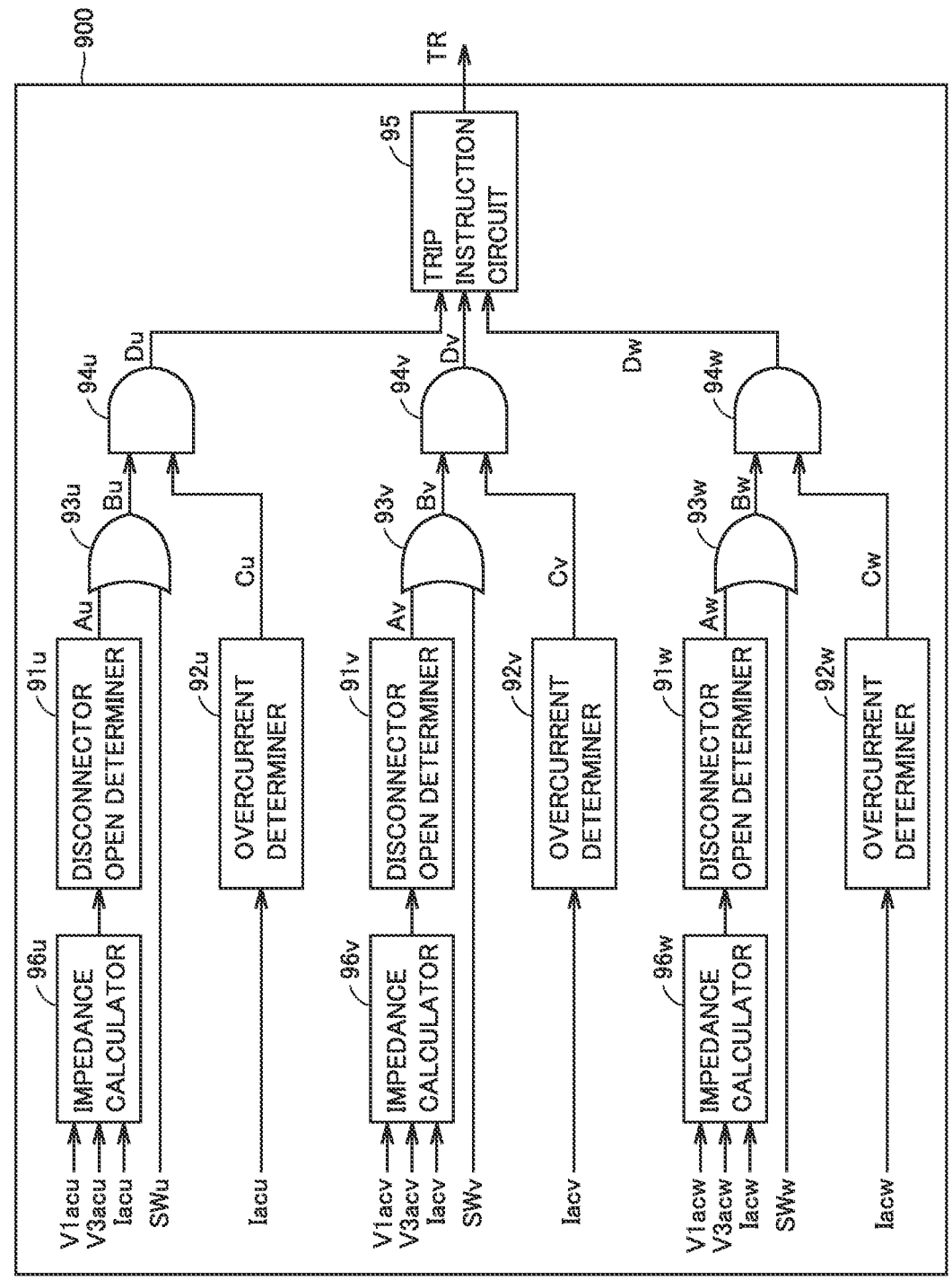
FIG. 12 is a block diagram of a trip control system 900 that implements some of control functions by a controller 50 in Embodiment 3.

FIG. 12 is a block diagram of trip control system 900 that implements some of control functions by controller 50 in Embodiment 3. The functions of the respective blocks shown in FIG. 12 can be implemented through software processing and/or hardware processing by controller 50. Trip control system 900 of FIG. 12 is different from trip control system 900 of Embodiment 1 shown in FIG. 6 in inputs of impedance calculators 96u, 96v, 96w.

Impedance calculator 96u calculates impedance Ru of a path between second end P2u of current control circuit 30u and AC terminal Nu based on voltage V1acu of AC terminal Nu which is detected by voltage detector 83u, voltage V3acu of U-phase at second end P2u of current control circuit 30u which is detected by voltage detector 84u, and current Iacu of U-phase flowing between AC system 80 and power converter 2 which is detected by current detector 82u in accordance with the following equations.

$$\Delta Vu = V1acu - V3acu \tag{G1}$$

$$Zu = \Delta Vu / Iacu \tag{G2}$$

$$\Delta Vu = |\Delta Vu|\{\cos(\theta 1u) + i\sin(\theta 1u)\} \tag{G3}$$

$$Iacu = |Iacu|\{\cos(\theta 2u) + i\sin(\theta 2u)\} \tag{G4}$$

$$Ru = |Zu|\cos(\theta 1u - \theta 2u) \tag{G5}$$

$$|Zu| = |\Delta Vu|/|Iacu| \tag{G6}$$

Impedance calculator 96v calculates impedance Rv of a path between second end P2v of current control circuit 30v and AC terminal Nv based on voltage V1acv of AC terminal Nv which is detected by voltage detector 83v, voltage V3acv of V-phase at second end P2v of current control circuit 30v which is detected by voltage detector 84v, and current Iacv of V-phase flowing between AC system 80 and power converter 2 which is detected by current detector 82v in accordance with the following equations.

$$\Delta Vv = V1acv - V3acv \tag{H1}$$

$$Zv = \Delta Vv / Iacv \tag{H2}$$

$$\Delta Vv = |\Delta Vv|\{\cos(\theta 1v) + i\sin(\theta 1v)\} \tag{H3}$$

$$Iacv = |Iacv|\{\cos(\theta 2v) + i\sin(\theta 2v)\} \tag{H4}$$

$$Rv = |Zv|\cos(\theta 1v - \theta 2v) \tag{H5}$$

$$|Zv| = |\Delta Vv|/|Iacv| \tag{H6}$$

Impedance calculator 96w calculates impedance Rw of a path between second end P2w of current control circuit 30w and AC terminal Nw based on voltage V1acw of AC terminal Nw which is detected by voltage detector 83w, voltage V3acw of W-phase at second end P2w of current control circuit 30w which is detected by voltage detector 84w, and current Iacw of W-phase flowing between AC system 80 and power converter 2 which is detected by current detector 82w.

$$\Delta Vw = V1acw - V3acw \tag{I1}$$

$$Zw = \Delta Vw / Iacw \tag{I2}$$

$$\Delta Vw = |\Delta Vw|\{\cos(\theta 1w) + i\sin(\theta 1w)\} \tag{I3}$$

$$Iacw = |Iacw|\{\cos(\theta 2w) + i\sin(\theta 2w)\} \tag{I4}$$

$$Rw = |Zw|\cos(\theta 1w - \theta 2w) \tag{I5}$$

$$|Zw| = |\Delta Vw|/|Iacw| \tag{I6}$$

Although impedances Ru, Rv, Rw of Embodiment 3 are different from impedances Ru, Rv, Rw of Embodiment 1 because their target paths are different, also in Embodiment 3, reference values TH1u, TH1v, TH1w used in disconnector open determiners 91u, 91v, 91w are set as in Embodiment 1.

Next, voltages, currents, and impedances are compared between when disconnector 32 is opened and when disconnector 32 is closed.

Figure 13A:
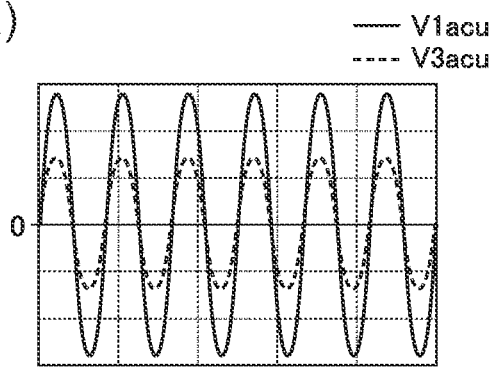
FIG. 13(a) shows simulation waveforms of a voltage V1acu and a voltage V3acu when a disconnector 32u is opened.

FIG. 13(a) shows simulation waveforms of voltage V1acu and voltage V3acu when disconnector 32u is opened. When disconnector 32u is opened, voltage V1acu is different from voltage V3acu3.

Figure 13B:
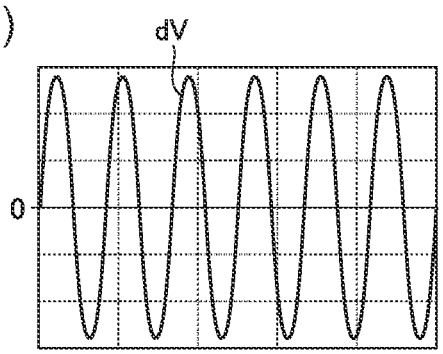
FIG. 13(b) shows a simulation waveform of $\Delta Vu$ when disconnector 32u is opened.

FIG. 13(b) shows a simulation waveform of ΔVu when disconnector 32u is opened. Since voltage V1acu is different from voltage V3acu, ΔVu is not a constant value "0".

Figure 13C:
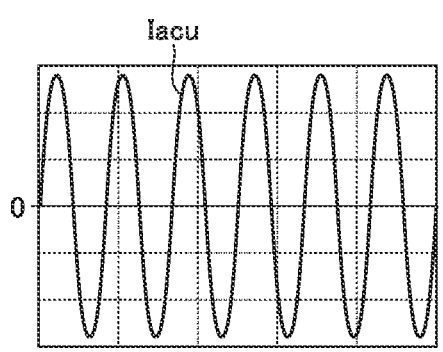
FIG. 13(c) shows a simulation waveform of a current Iacu when disconnector 32u is opened.

FIG. 13(c) shows a simulation waveform of current Iacu when disconnector 32u is opened. In the examples of FIGS. 13(b) and 13(c), current Iacu and ΔVu are in phase.

Figure 13D:
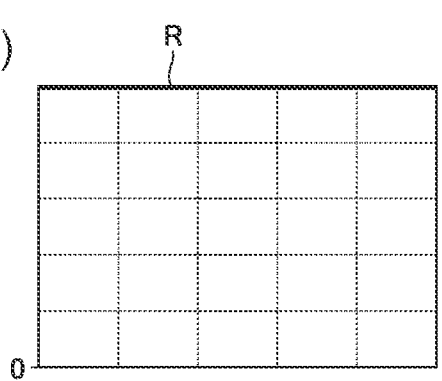
FIG. 13(d) shows a simulation waveform of an impedance Ru when disconnector 32u is opened.

FIG. 13(d) shows a simulation waveform of impedance Ru when disconnector 32u is opened. Since ΔVu is not a constant value "0", impedance Ru is a constant value |ΔVu|/|Iacu|.

Figure 14A:
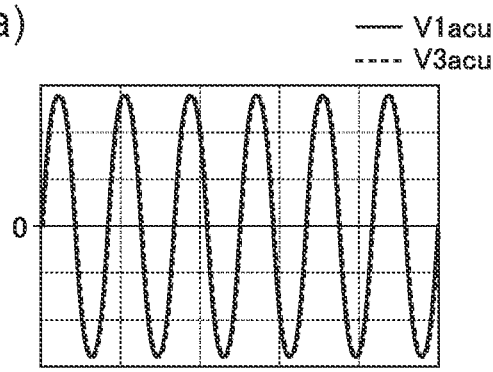
FIG. 14(a) shows simulation waveforms of voltage V1acu and voltage V3acu when disconnector 32u is closed.

FIG. 14(a) shows simulation waveforms of voltage V1acu and voltage V3acu when disconnector 32u is closed. When disconnector 32u is closed, voltage V1acu is equal to voltage V3acu.

Figure 14B:
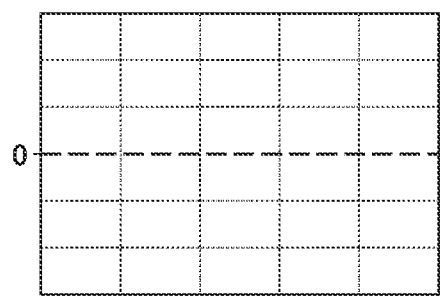
FIG. 14(b) shows a simulation waveform of $\Delta Vu$ when disconnector 32u is closed.

FIG. 14(b) shows a simulation waveform of ΔVu when disconnector 32u is closed. Since voltage V1acu is equal to voltage V3acu, ΔVu is the constant value "0".

Figure 14C:
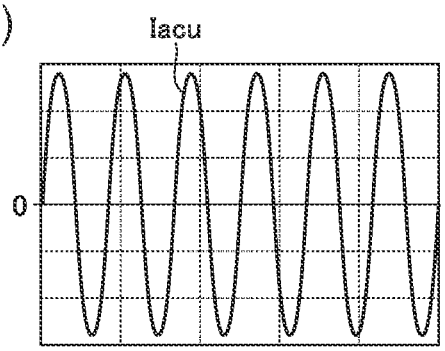
FIG. 14(c) shows a simulation waveform of current Iacu when disconnector 32u is closed.

FIG. 14(c) shows a simulation waveform of current Iacu when disconnector 32u is closed.

Figure 14D:
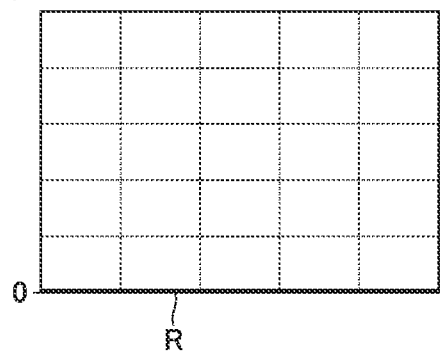
FIG. 14(d) shows a simulation waveform of impedance Ru when disconnector 32u is closed.

FIG. 14(d) shows a simulation waveform of impedance Ru when disconnector 32u is closed. Since ΔVu is the constant value "0", impedance Ru is the constant value "0".

Similarly to Embodiment 1, the present embodiment can prevent an excessive current from flowing through a current-limiting resistor by opening an AC circuit breaker based on an impedance of a line between a first node located on a first end side of a current control circuit and a second node located on a second end side of the current control circuit and a current flowing through the current control circuit. Further, the present embodiment can obtain an impedance using one voltage detector and one current detector, leading to fewer voltage sensors than in Embodiment 3.

Embodiment 4

Figure 15:
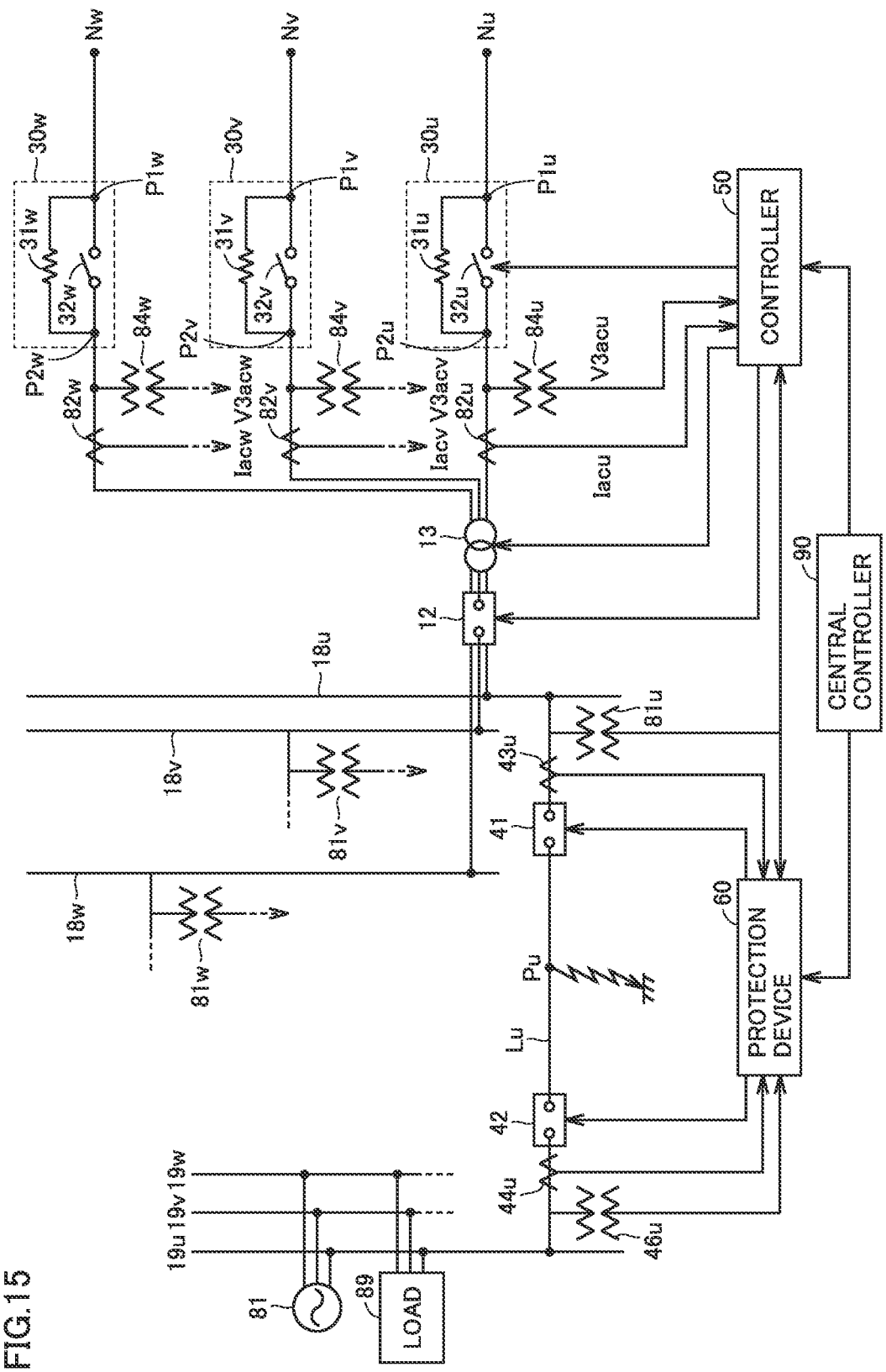
FIG. 15 is a diagram for illustrating a configuration of an AC system 80 and a configuration between AC system 80 and a power converter 2 in Embodiment 4.

FIG. 15 is a diagram for illustrating a configuration of AC system 80 and a configuration between AC system 80 and power converter 2 in Embodiment 4.

A power control system of Embodiment 4 is different from the power control system of Embodiment 1 in that voltage detectors 84u, 84v, 84w are provided and voltage detectors 83u, 83v, 83w are not provided. In Embodiment 4, controller 50 controls AC circuit breaker 12 to close and open using AC voltage command values Vacrefu, Vacrefv, Vacref calculated by controller 50 in place of the detected voltages V1acu, V1acv, V1acw of AC terminals Nu, Nv, Nw and also using voltages V3acu, V3acv, V3acw detected by voltage detectors 84u, 84v, 84w in place of voltages V2acu, V2acu, V2acw detected by voltage detectors 81u, 81v, 81w.

Voltage detector 84u detects voltage V3acu of U-phase at second end P2u of current control circuit 30u. Voltage detector 84v detects voltage V3acv of V-phase at second end P2v of current control circuit 30v. Voltage detector 84w detects voltage V3acw of W-phase at second end P2w of current control circuit 30w.

Figure 16:
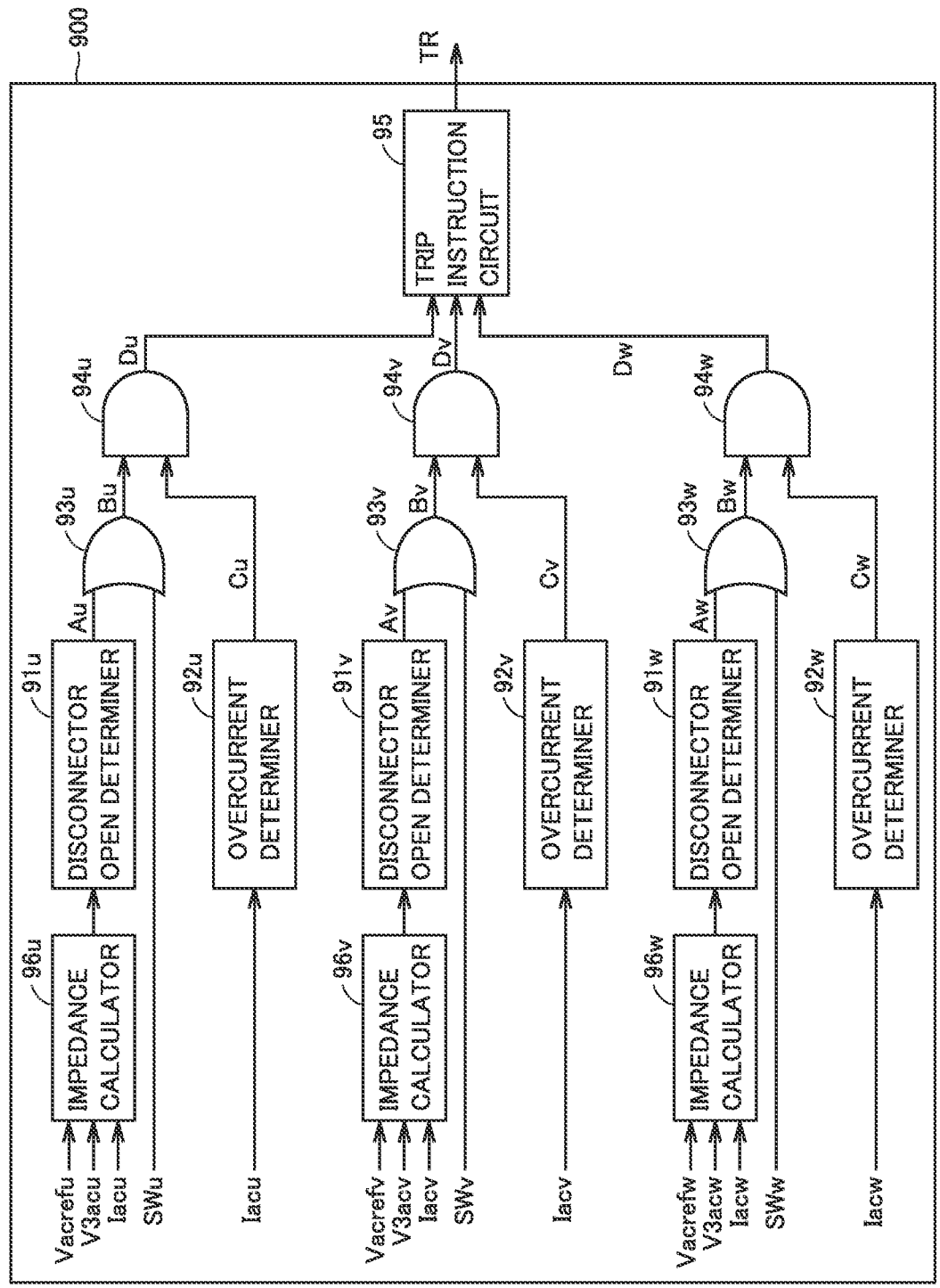
FIG. 16 is a block diagram of a trip control system 900 that implements some of control functions by a controller 50 in Embodiment 4.

FIG. 16 is a block diagram of trip control system 900 that implements some of control functions by controller 50 in Embodiment 4. The functions of the respective blocks shown in FIG. 16 can be implemented through software processing and/or hardware processing by controller 50. Trip control system 900 of FIG. 16 is different from trip control system 900 of Embodiment 1 shown in FIG. 6 in inputs of impedance calculators 96u, 96v, 96w.

Impedance calculator 96u calculates impedance Ru of the path between second end P2u of current control circuit 30u and AC terminal Nu based on AC voltage command value Vacrefu of U-phase which is calculated by controller 50, voltage V3acu of U-phase at second end P2u of current control circuit 30u which is detected by voltage detector 84u, and current Iacu of U-phase flowing between AC system 80 and power converter 2 which is detected by current detector 82u in accordance with the following equations.

$$\Delta Vu = Vacrefu - V3acu \tag{J1}$$

$$Zu = \Delta Vu / Iacu \tag{J2}$$

$$\Delta Vu = |\Delta Vu|\{\cos(\theta 1u) + i\sin(\theta 1u)\} \tag{J3}$$

$$Iacu = |Iacu|\{\cos(\theta 2u) + i\sin(\theta 2u)\} \tag{J4}$$

$$Ru = |Zu|\cos(\theta 1u - \theta 2u) \tag{J5}$$

$$|Zu| = |\Delta Vu|/|Iacu| \tag{J6}$$

Impedance calculator 96v calculates impedance Rv of the path between second end P2v of current control circuit 30v and AC terminal Nv based on AC voltage command value Vacrefv of V-phase which is calculated by controller 50, voltage V3acv of V-phase at second end P2v of current control circuit 30v which is detected by voltage detector 84v, and current Iacv of V-phase flowing between AC system 80 and power converter 2 which is detected by current detector 82v in accordance with the following equations.

$$\Delta Vv = Vacrefv - V3acv \tag{K1}$$

$$Zv = \Delta Vv / Iacv \tag{K2}$$

$$\Delta Vv = |\Delta Vv|\{\cos(\theta 1v) + i\sin(\theta 1v)\} \tag{K3}$$

$$Iacv = |Iacv\{\cos(\theta 2v) + i\sin(\theta 2v)\} \tag{K4}$$

$$Rv = |Zv|\cos(\theta 1v - \theta 2v) \tag{K5}$$

$$|Zv| = |\Delta Vv|/|Iacv| \tag{K6}$$

Impedance calculator 96w calculates impedance Rw of the path between second end P2w of current control circuit 30w and AC terminal Nw based on AC voltage command value Vacrefw of W-phase which is calculated by controller 50, voltage V3acw of W-phase at second end P2w of current control circuit 30w which is detected by voltage detector 84w, and current Iacw of W-phase flowing between AC system 80 and power converter 2 which is detected by current detector 82w in accordance with the following equations.

$$\Delta Vw = Vacrefw - V3acw \tag{L1}$$

$$Zw = \Delta Vw / Iacw \tag{L2}$$

$$\Delta Vw = |\Delta Vw|\{\cos(\theta 1w) + i\sin(\theta 1w)\} \tag{L3}$$

$$Iacw = |Iacw|\{\cos(\theta 2w) + i\sin(\theta 2w)\} \tag{L4}$$

$$Rw = |Zw|\cos(\theta 1w - \theta 2w) \tag{L5}$$

$$|Zw| = |\Delta Vw|/|Iacw| \tag{L6}$$

Although impedances Ru, Rv, Rw of Embodiment 4 are different from impedances Ru, Rv, Rw of Embodiment 1 because their target paths are different, also in Embodiment 4, reference values TH1u, TH1v, TH1w used in disconnector open determiners 91u, 91v, 91w are set as in Embodiment 1.

The present embodiment can prevent an excessive current from flowing through a current-limiting resistor by opening an AC circuit breaker based on an impedance of a line between a first node located on a first end side of a current control circuit and a second node located on a second end side of the current control circuit and a current flowing through the current control circuit as in Embodiment 3. Further, the present embodiment can obtain an impedance using one voltage detector and one current detector, leading to fewer voltage sensors than in Embodiment 3.

The present invention is not limited to the above embodiments and includes, for example, modifications as described below.

(1) Position of Current Detector

Although current detectors 82u, 82v, 82w are disposed between second ends P2u, P2v, P2w of current control circuits 30u, 30v, 30w and transformer 13 in the above embodiments, the present invention is not limited thereto. For example, current detectors 82u, 82v, 82w may be disposed between AC circuit breaker 12 and transformer 13.

(2) Impedance Calculator

Impedance calculator 96u may calculate impedance Ru only when switch signal SWu is set to "0" for instructing disconnector 32u to close. Impedance calculator 96v may calculate impedance Rv only when switch signal SWv is set to "0" for instructing disconnector 32v to close. Impedance calculator 96w may calculate impedance Rw only when switch signal SWw is set to "0" for instructing disconnector 32w to close.

It is to be understood that the embodiments disclosed herein are presented for the purpose of illustration and non-restrictive in every respect. It is therefore intended that the scope of the present invention is defined by claims, not only by the embodiments described above, and encompasses all modifications and variations equivalent in meaning and scope to the claims.

REFERENCE SIGNS LIST 2, 2A power converter; 4u, 4v, 4w leg circuit; 5u, 5v, 5w upper arm; 6u, 6v, 6w lower arm; 7 submodule; 8A, 8B reactor; 9A, 9B arm current detector; 11A, 11B DC voltage detector; 12, 12A AC circuit breaker; 13, 13A transformer; 14N, 14P DC power transmission line; 16 DC current detector; 18u, 18v, 18w, 19u, 19v, 19w AC bus; 20HB conversion circuit; 22A, 22B switching element; 23A, 23B diode; 24 DC capacitor; 26N, 26P input-output terminal; 30, 30A, 30u, 30v, 30w current control circuit; 31, 31A, 31u, 31v, 31w current-limiting resistor; 32, 32A, 32u, 32v, 32w disconnector; 41, 42 circuit breaker; 43u, 43v, 43w, 44u, 44v, 44w, 82u, 82v, 82w current detector; 46u, 46v, 46w, 81*u*, 81*v*, 81*w*, 83*u*, 83*v*, 83*w*, 84*u*, 84*v*, 84*w* voltage detector; 50, 50A controller; 60 protection device; 80, 80A AC system; 81 power generator; 89 load; 90 central controller; 91*u*, 91*v*, 91*w* disconnector open determiner; 93*u*, 93*v*, 93*w* first logic circuit; 94*u*, 94*v*, 94*w* second logic circuit; 95 trip instruction circuit; 96*u*, 96*v*, 96*w* impedance calculator; 200, 300 power conversion control system; 201 voltage command value generation unit; 250, 260 gate control unit; 210 AC control unit; 220 DC control unit; 230, 240 command value combining unit; 310 capacitor voltage control unit; 320 AC current control unit; 330 DC voltage control unit; 340 DC current control unit; 345 control output combining unit; 530 AD conversion unit; 531 analog filter; 532 AD converter; 535 processing unit; 536 CPU; 537 memory; 538, 539 bus I/F; 540 bus; 543 IO unit; 544 communication circuit; 545 digital input circuit; 546 digital output circuit; 547 setting and display unit; 548 setting and display touch panel; 555 optical relay device; 900 trip control system; Lu, Lv, Lw power transmission line; Nn low-potential-side DC terminal; Np high-potential-side DC terminal; Nu, Nv, Nw AC input terminal.

The invention claimed is:

1. A power control system comprising:
a power converter of self-excited type including a first arm and a second arm each including one or more switching elements, the power converter performing power conversion between a DC system and an AC system;
an AC circuit breaker and a current control circuit connected in series on a path between the AC system and the power converter; and
the current control circuit including a current-limiting resistor and a disconnector connected in parallel,
a controller to instruct the disconnector to close after an initial charge of the power converter and open the AC circuit breaker when an impedance of a line between a first node located on a first end side of the current control circuit and a second node located on a second end side of the current control circuit is not less than a first threshold and an accumulated value of a current flowing through the current control circuit within a certain period of time is not less than a second threshold.

2. The power control system according to claim 1, wherein
the first node is connected to an AC terminal of the power converter, and
the power control system further comprises a first detector to detect a voltage of the first node.

3. The power control system according to claim 2, wherein the controller generates an AC voltage command value of the power converter based on the voltage of the first node detected by the first detector.

4. The power control system according to claim 1, wherein
the first node is connected to an AC terminal of the power converter, and
a voltage of the first node is an AC voltage command value of the power converter.

5. The power control system according to claim 1, wherein
the second node is connected to a first AC system bus, and
the power control system further comprises a second detector to detect a voltage of the second node.

6. The power control system according to claim 5, further comprising a protection device to conduct or interrupt a current flowing through a power transmission line connecting the first AC system bus and a second AC system bus based on the voltage of the second node detected by the second detector.

7. The power control system according to claim 1, wherein
the second node is directly connected to a second end of the current control circuit, and
the power control system further comprises a second detector to detect a voltage of the second node.

8. The power control system according to claim 1, further comprising a current detector to detect a current flowing through the current control circuit.

9. The power control system according to claim 8, wherein the controller generates an AC voltage command value of the power converter based on the current detected by the current detector.

10. The power control system according to claim 1, wherein the controller further instructs the disconnector to open in an initial charge of the power converter and opens the AC circuit breaker when the accumulated value of the current flowing through the current control circuit within the certain period of time is not less than the second threshold.

11. The power control system according to claim 10, wherein
the controller sets a switch signal for the disconnector to a first level when instructing the disconnector to open in the initial charge of the power converter, and sets the switch signal for the disconnector to a second level when instructing the disconnector to close after the initial charge of the power converter,
the controller includes
an impedance calculator to calculate an impedance of the line between the first node and the second node,
a disconnector open determiner to set an open determination signal to a first level when the calculated impedance is not less than the first threshold and set the open determination signal to a second level when the calculated impedance is less than the first threshold,
a first logic circuit to perform a logical computation of the switch signal and the open determination signal,
an overcurrent determiner to set an overcurrent determination signal to a first level when the accumulated value of the current flowing through the current control circuit within the certain period of time is not less than the second threshold and set the overcurrent determination signal to a second level when the accumulated value of the current flowing through the current control circuit within the certain period of time is less than the second threshold, and
a second logic circuit to perform a logical computation of the overcurrent determination signal and an output signal of the first logic circuit.

12. The power control system according to claim 11, wherein
the AC system is a three-phase AC system of U-phase, V-phase, and W-phase,
the current control circuit, the impedance calculator, the disconnector open determiner, the first logic circuit, the overcurrent determiner, and the second logic circuit are provided for each of U-phase, V-phase, and W-phase, and
the controller includes a trip instruction circuit to output a trip signal for opening the AC circuit breaker when at least one of an output of the second logic circuit of U-phase, an output of the second logic circuit of V-phase, and an output of the second logic circuit of W-phase is at a first level.

13. A controller for a power control system, the power control system including
- a power converter of self-excited type including a first arm and a second arm each including one or more switching elements, the power converter performing power conversion between a DC system and an AC system, and
- an AC circuit breaker and a current control circuit connected in series on a path between the AC system and the power converter, the current control circuit including a current-limiting resistor and a disconnector connected in parallel,
- wherein the controller instructs the disconnector to close after an initial charge of the power converter and opens the AC circuit breaker when an impedance of a line between a first node located on a first end side of the current control circuit and a second node located on a second end side of the current control circuit is not less than a first threshold and an accumulated value of a current flowing through the current control circuit within a certain period of time is not less than a second threshold.

* * * * *